(12) United States Patent
Birkbeck

(10) Patent No.: US 7,288,992 B2
(45) Date of Patent: Oct. 30, 2007

(54) BIAS CIRCUIT FOR A BIPOLAR TRANSISTOR

(75) Inventor: John David Birkbeck, New Milton (GB)

(73) Assignee: Roke Manor Research Limited, Romsey (GB)

( * ) Notice: Subject to any disclaimer, the term of this patent is extended or adjusted under 35 U.S.C. 154(b) by 208 days.

(21) Appl. No.: 10/508,038

(22) PCT Filed: Mar. 18, 2003

(86) PCT No.: PCT/GB03/01167

§ 371 (c)(1),
(2), (4) Date: May 4, 2005

(87) PCT Pub. No.: WO03/081771

PCT Pub. Date: Oct. 2, 2003

(65) Prior Publication Data

US 2005/0218991 A1  Oct. 6, 2005

(30) Foreign Application Priority Data

| Mar. 20, 2002 | (GB) | ................................. 0206571.2 |
| Aug. 15, 2002 | (GB) | ................................. 0218920.7 |
| Feb. 24, 2003 | (GB) | ................................. 0304053.2 |

(51) Int. Cl.
*H03F 3/04* (2006.01)

(52) U.S. Cl. .................................................... 330/296

(58) Field of Classification Search ..................... None
See application file for complete search history.

(56) References Cited

U.S. PATENT DOCUMENTS

| 3,963,030 | A | * | 6/1976 | Newton ........................ 606/40 |
| 5,436,595 | A | * | 7/1995 | Wholey et al. .............. 330/296 |
| 5,637,993 | A | | 6/1997 | Whitney et al. |
| 5,646,520 | A | * | 7/1997 | Frank et al. .............. 324/158.1 |
| 5,670,912 | A | | 9/1997 | Zocher |
| 5,737,204 | A | * | 4/1998 | Brown ......................... 363/89 |
| 5,867,014 | A | * | 2/1999 | Wrathall et al. ............. 323/316 |
| 5,986,508 | A | | 11/1999 | Nevin |
| 6,218,906 | B1 | | 4/2001 | Lohninger |
| 6,344,775 | B1 | | 2/2002 | Kuriyama et al. |
| 6,509,722 | B2 | * | 1/2003 | Lopata ......................... 323/280 |
| 6,803,822 | B2 | * | 10/2004 | Kim et al. ................... 330/296 |
| 6,842,075 | B2 | * | 1/2005 | Johnson et al. ............. 330/296 |
| 6,922,107 | B1 | * | 7/2005 | Green ......................... 330/296 |

FOREIGN PATENT DOCUMENTS

| EP | 0 942 524 A | 9/1999 |
| WO | WO 01 /67594 A1 | 1/2001 |

* cited by examiner

*Primary Examiner*—Robert Pascal
*Assistant Examiner*—Krista M Flanagan
(74) *Attorney, Agent, or Firm*—Crowell & Moring LLP

(57) ABSTRACT

The bias circuit of the present invention can be configured for extremely stiff biasing for Class A circuits, which is solid under heavy RF input overdrive. Alternatively, the circuit may be configured for controlled self biasing for use in Class AB designs.

19 Claims, 16 Drawing Sheets

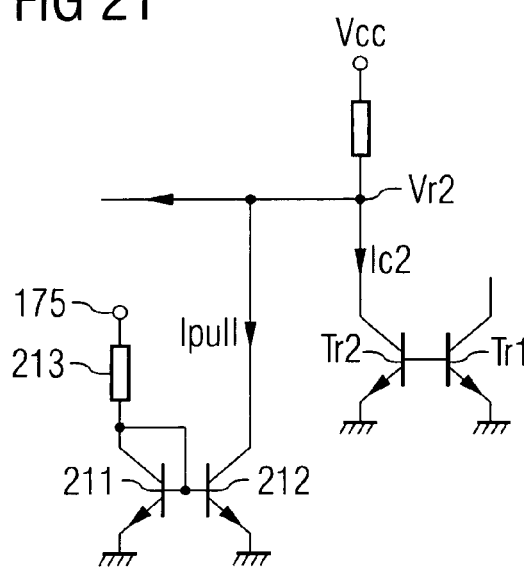
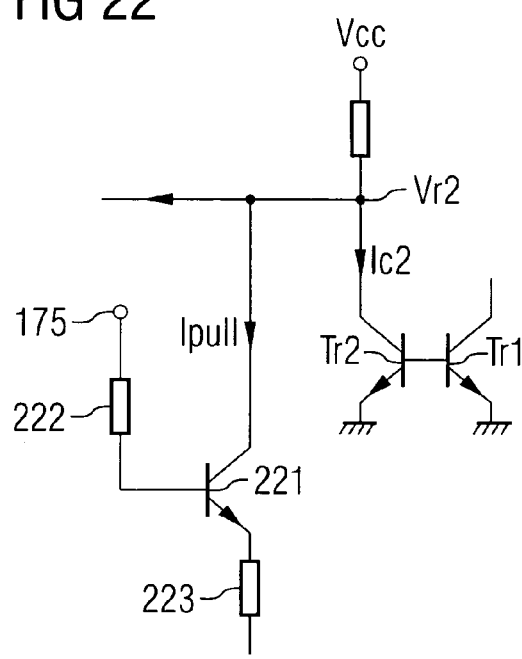
FIG 21
FIG 22
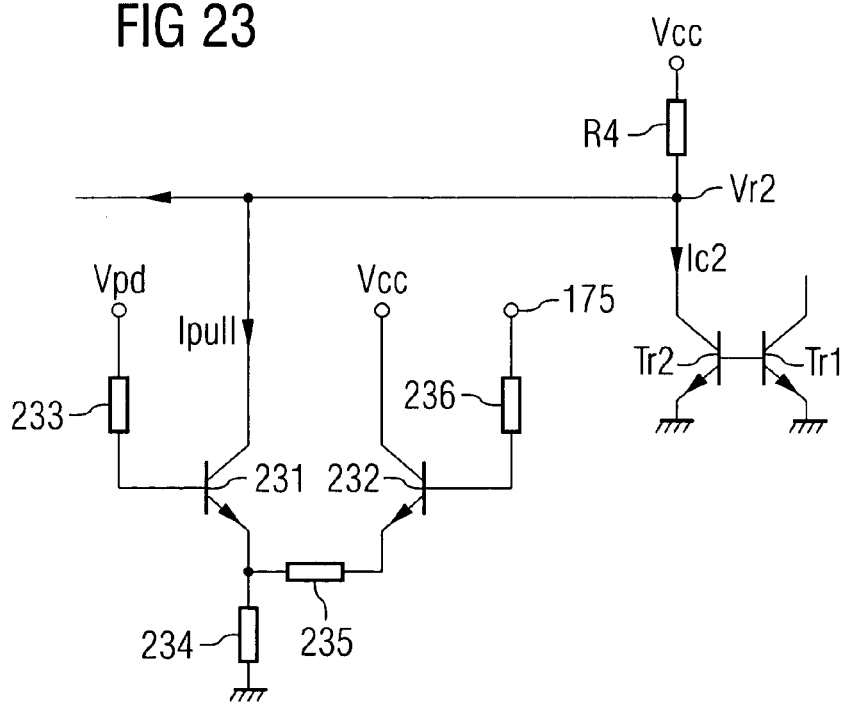
FIG 23

BIAS CIRCUIT FOR A BIPOLAR TRANSISTOR

The present invention relates to a bias circuit for a bipolar transistor. In particular, the invention relates to a bias circuit topology for radio frequency and microwave based bipolar amplification and function circuits.

BACKGROUND OF THE INVENTION

The present invention has particular application to HBT MMICs (hetero-junction bipolar transistor monolithic microwave integrated circuits). An HBT MMIC is an integrated circuit using bipolar transistors, suitable for generation of relatively high radio frequency power levels. The present invention finds application in the transmitter path of a mobile phone handset. It is particularly suited to applications using linear modulation, such as the CDMA and W-CDMA schemes, as used in the emerging UMTS market.

HBT MMIC integrated circuits likely to be required in the transmit path of a handset include Driver Amplifiers, Variable Gain Amplifiers (VGA), and Power Amplifiers (PA).

Optimal RF performance of an HBT MMIC can only be achieved with a suitably designed bias circuit. The design of bias circuits for HBT MMICs needs to contend with at least some of the following problems.

The available battery voltage may be 3.0V or less. The typical base-emitter voltage of an HBT is 1.2-1.4V. This means that it is difficult to provide sufficient voltage to operate circuits having multiple 'stacked' HBT devices, which are ideally required.

The interaction of the RF signal with the bias circuit needs to be carefully addressed to ensure that RF performance is maintained over the full range of possible operating conditions, whilst maintaining DC efficiency.

To facilitate accurate setting of quiescent current levels, in the active bipolar devices, a regulated signal, most usually a voltage, is supplied to the HBT MMIC from the equipment. In the case of a mobile phone handset, the unregulated output of the battery Vcc which may vary from 3-6.5v, is regulated down to typically 2.8V±0.1V by additional circuitry within the mobile phone. This regulated signal is usually switched between 0V and 2.8V in order to provide power down signalling on the same line.

This regulator may supply several circuits within the mobile phone, and usually operates near the upper limit of its current supply rating. 1-5 mA may be available to the bias circuit on the HBT MMIC being described, and limiting current draw from this regulated line to a minimum level is a technical challenge. A MMIC with a high current draw from this regulated line will be less attractive to the market.

A power-down feature is also desirable in a battery operated device. HBT MMICs are often constructed in NPN arrangement only. In this case, it has been found difficult to design bias circuits which are capable of power-down to a very low current drain, without requiring a significant level of control current in the 'on-state'.

Different bias arrangements are required for various RF circuits. A small-signal 'class A' circuit generally needs a bias circuit offering a good level of RF immunity, to avoid performance degradation due to self-biasing. A 'deep class AB' power amplifier circuit needs a high, but controlled, level of interaction between the active devices and the bias circuit under increasing RF drive level, if the required self-biasing profile is to be achieved.

PRIOR ART

The work that led to this invention was primarily concerned with finding a bias solution for a Class A variable gain amplifier/driver, that drew as little current as possible from the switched reference line, and did not self bias even under heavy RF overdrive.

One known solution for this sort of bias circuit is the classic bipolar bias circuit consisting of a simple potentiometer (from the regulated control line to ground) feeding the base of the active device, which has an additional resistor in its emitter arm to ground. A simple VGA constructed using this technique drew 7 mA from the switched regulated supply.

The present invention aims, among other things, to transfer where possible, bias current draw from the regulated 2.8V (2.7-2.9V) control line to the unregulated supply line Vcc (3-6.5V), by use of a differential current comparator. The circuit of the invention has been shown to draw <300 μA from the switched regulated supply for a VGA constructed in similar circumstances.

Several other known bias circuits exist for the case of biasing deep Class AB/saturated power amplifiers. In general, a slightly different bias circuit is needed for power amplification in linear modulation schemes (where deep Class AB is needed), and GSM type modulation schemes (where saturated mode is needed). Known solutions range from simple emitter followers with compensating diode stacks, through to considerably more elaborate mirror circuits. While each of the circuits have apparently provided manufacturable solutions, the current drawn from the switched reference line is in all cases rather high. Furthermore, several of the known solutions are very 'interactive', and are therefore difficult to set up for the right quiescent current, self biasing profile, linearity, temperature stability etc, and are therefore more prone to manufacturing drift.

Certain known bias circuits are described in U.S. Pat. No. 6,313,705, U.S. Patent Application 2001/0048347 and European Patent Application 0 605 181.

European Patent Application 1 132 793 describes a circuit arrangement which generates an output voltage (V0) which is independent of the actual value of the supply voltage (VCC), and comprises a device for generating a reference voltage, together with one or several collector current sources which are respectively formed by a transistor. The base of each transistor is respectively connected with the output of the reference voltage source. The emitter of each transistor is connected with ground, and the respective collector with a voltage source for the supply voltage, preferably over a resistance.

SUMMARY OF THE INVENTION

The present invention accordingly provides apparatus as set out in the appended claims.

BRIEF DESCRIPTION OF THE DRAWINGS

The above, and further, objects, characteristics and advantages of the present invention will become more apparent from the following description of certain embodiments, with reference to the accompanying drawings, wherein:

FIGS. 20-27 each illustrate a variation which may be applied to vary the sense signal.

DETAILED DESCRIPTION OF THE INVENTION

The present invention accordingly provides a transistor bias circuit which provides at least some of the following advantages:

Low control current drain from Vpd, typically 300 μA as compared to 7 mA for known circuits;

excellent process tolerance: the circuit function preferably relies largely on component ratios, rather than absolute values;

excellent power supply tolerance;

excellent temperature tolerance;

ability to control interaction with RF signals;

excellent RF power level immunity, where required; and enables optimum RF performance to be obtained from the active devices.

Figure 14:
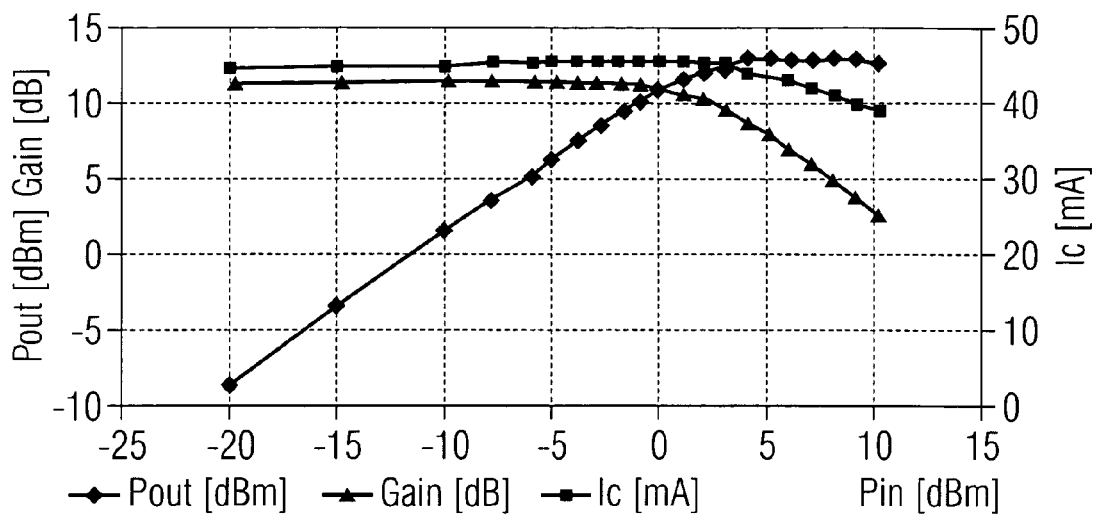
FIG. 14 shows a plot of output power over a range of input powers, at maximum gain for a circuit according to the present invention.

The circuit of the present invention may be configured for circuits requiring different operation classes, from small signal Class A circuits through to deep Class AB circuits such as power amplifiers. It is especially suited to circuits using a bipolar process with a high base-emitter junction voltage (Vbe) relative to the supply voltage (Vcc), such as HBT MMIC circuits for portable mobile communication equipment. A practical implementation of the present invention in the form of a small signal VGA/driver MMIC was found to provide a high level of immunity to the RF signal. The measured results from this circuit are shown in FIG. 14. FIG. 14 shows a power sweep at maximum gain for an example circuit of the present invention, and shows a high level of immunity of current Ic to severe RF overdrive. The circuit demonstrates a collector current Ic reduced by 15% with the amplifier input power in 10 dB into compression.

This implementation drew a relatively low current from the regulated control line and operated well at low voltages.

Other advantages of the bias circuit of the invention include its compact space requirements in an integrated circuit implementation, and minimum of off-chip support components. As entioned above, the accuracy of the circuit is determined primarily by component ratios, rather than absolute values. This is of great importance in integrated circuit implementations, where component ratios may be controlled much more closely than actual component values. This leads directly to an increased production yield.

In designing the bias circuit of the invention, proper attention needs to be given to minimising degradation of the overall noise figure and linearity performance. Certain features may be introduced into the bias circuit of the present invention in order to maintain linearity levels and noise figure.

Figure 1:
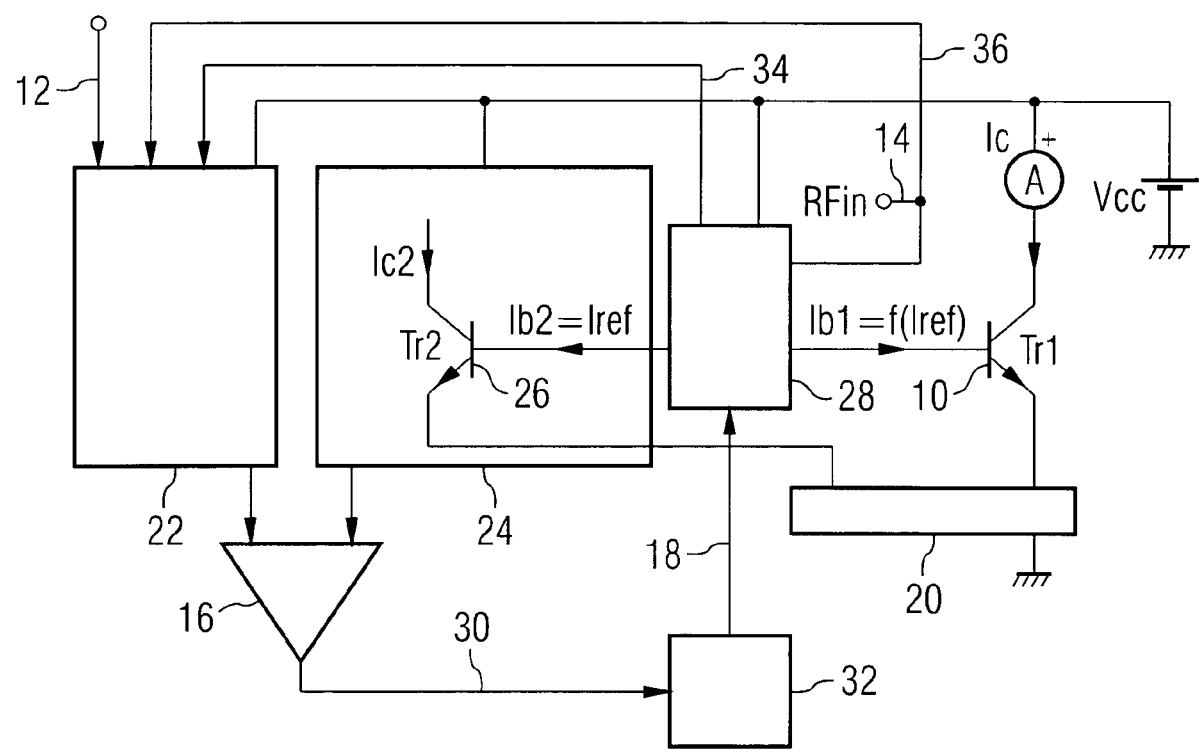
FIG. 1 shows a block level schematic diagram illustrating a bias circuit according to the present invention.

FIG. 1 shows a block level schematic diagram illustrating the bias circuit of the invention, provided to set the collector current Ic of transistor Tr1 10 in a controlled manner. In FIG. 1, items such as the power down circuitry are not shown.

The purpose of the circuit of FIG. 1 is to set up a quiescent collector current Ic in transistor Tr1 10, which is a function of a current setting signal 12, and the level of an input RF signal RFin 14. An aspect of the present invention concerns the use of a closed loop bias circuit on maintaining linearity in a bipolar amplifier, as will be further discussed below. The use of a closed loop control circuit employs a 'wanted' signal, that is the current setting signal 12, an error amplifier 16 and a feedback signal 18.

Operation of the circuit of FIG. 1 is as follows.

Transistor Tr1 10 is the transistor to be biased by the circuit of the present invention. In this example, it is to be used for RF amplification, and may or may not use emitter degeneration. Emitter degeneration, if required, may be provided by optional emitter degeneration circuit 20.

The optional emitter degeneration circuit 20 acts to reduce the maximum RF gain and improve ease of matching, which may be useful in some applications.

A supply voltage Vcc and a ground voltage are provided as shown. Vcc may typically be 2.8-6.5V supplied by a battery, or a battery charger when the battery is on charge.

A current setting signal 12, typically a regulated supply voltage such as 2.8V, is applied from another part of the equipment, indicating that equipment operation, such as voice/data transmission, is required. The current setting signal 12 is typically applied as a ramp of 0V-2.8V. This signal is also known as Vpd, the power-down voltage. The application of the current setting signal 12 indicates that a required collector current Ic should be applied through controlled Transistor Tr1 10. A corresponding value of a reference current is established within a reference current generation circuit 22. The reference current is compared by error amplifier 16 to a sense current that is a function of the collector current Ic drawn by the Transistor Tr1 10, according to an output provided by current sensing circuit 24.

Current sensing circuit 24 contains a transistor Tr2 26 configured as a current mirror transistor with Transistor Tr1 10. Transistor Tr2 26 acts as a sensing device, providing a sense current Ic2 which is indicative of the collector current Ic flowing in Transistor Tr1 10. The mathematical expression relating the collector currents Ic, Ic2 of respective transistors Tr1 and Tr2 is determined by the ratio of their respective areas, and the bias class profiling circuit and base drive circuit 28. The expression may also be a function of the current setting signal 12 and the RF input level RFin 14 A general expression may thus be written as Ic=f(Ic$_2$). Typically, transistor Tr2 26 will be set to draw a low absolute current, to minimise current consumed by the circuit as a whole.

The transistors Tr1 10 and Tr2 26 are preferably related as a "solid" mirror circuit, that is, a current mirror with a constant scaling factor. In the more general case, it is possible to add the RFin signal 14 through a greater base resistance for Tr2 that for Tr1. This may however lead to reduced accuracy of current mirroring due to asymmetric RF bias.

The output of error amplifier 16, is the resultant error signal 30, 18. This is applied back to the bias class profiling circuit and base drive circuit 28, to close the loop of the control system.

The error signal 18 supplied to bias class profiling and base drive circuit 28 allows configuration from stiff class A to class AB with self bias, depending on the component values chosen.

Being a closed loop system, there is the possibility for unwanted oscillations to occur. An optional loop stabilisation and bandwidth enhancement circuit 32 provides for stabilisation elements to be inserted. A phase lead network may also be usefully inserted here, since in some instances, a control loop with a wide bandwidth has additional advantages, such as improved linearity and noise performance.

Finally, the dotted paths 34 and 36 show how bias class profiling can be further modified, by allowing the level of the RF signal RFin to modify the reference current either directly, 36, or through the bias class profiling circuit and base drive circuit 28, 34.

For Class A operation, the quiescent collector current of Tr1 10 is generally required to be a function only of the current setting signal 12, and be wholly independent of the RF level, such that even under heavy RF overdrive, the circuit does not self bias and generally upset the linearity of the RF signal. In this case, the choice of components in the bias class profiling and base drive circuit 28 are chosen such that the collector currents Ic and Ic$_2$ are related mathematically as close as possible to Ic=k Ic2, where k is some positive real number, and remains unaltered as far as possible by the application of the RF signal, even at relatively high levels.

Figure 2:
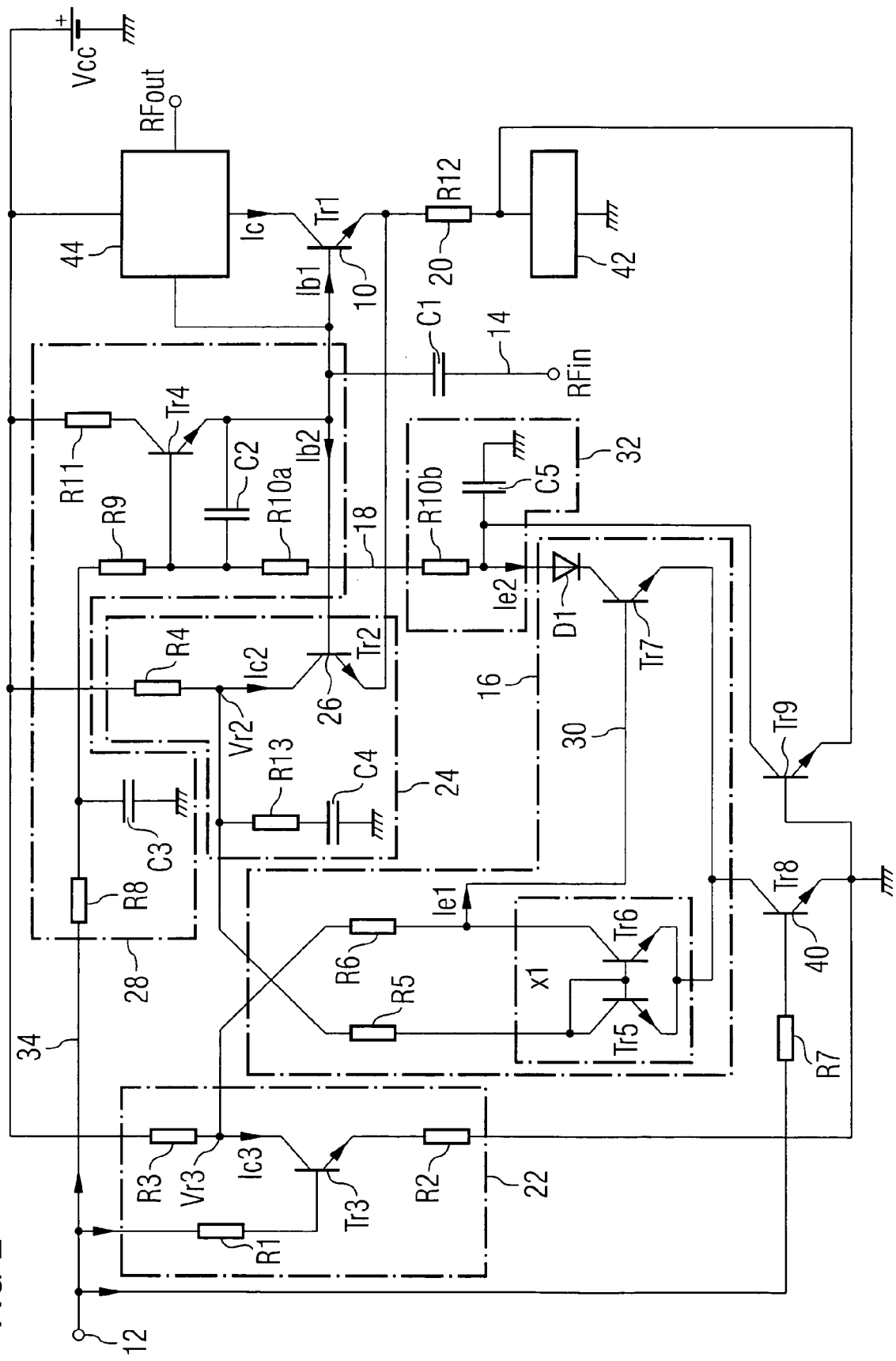
FIG. 2 shows a more detailed diagram of a circuit according to an embodiment of the invention.

A specific embodiment of the invention will now be described with reference to FIG. 2. The circuit illustrated in FIG. 2 is for stiff Class A bias; and a simpler version of this circuit was used successfully as part of an HBT VGA MMIC, for Vcc=3.0V to 6.0V operation. The circuit has a power down capability, but the simpler version manufactured did not include the diode D1, which led to a high leakage current in the off-state, that is, when Vpd=0V. Aside from the leakage current issue, the practical circuit performed very well. The following description includes diode D1, which will be incorporated in future designs.

Features common with FIG. 1 share common reference labels. While certain values are discussed for the various components, voltages and currents shown in FIG. 2, these are indicative only and must not be taken as limiting the invention in any way.

The operation of the embodiment of FIG. 2 is as follows. A current setting signal Vpd 12 is applied as shown. This may be equal to, or derived from, a stabilised reference voltage of 2.8V±0.1V. The positive signal brings the circuit into operation through a combination of several functions. The supply voltage Vcc, for example 3.0V-6.0V, is permanently applied to the circuit. The switching action of transistor Tr8 40 which is brought into saturation by the application of signal Vpd to its base, provides a connection to ground, thus activating the circuit. A resistor R7, for example 7.5 kΩ, may be interposed between the base of Tr8 40 and signal Vpd 12, to supply a base current of for example 200 μA. The signal Vpd is further connected to the bias class profiling circuit and base drive circuit, 28, to supply a current of for example 50 μA.

According to an aspect of the present invention, the use of a low side switch Tr8 40 provides power-down/current saving in the bias circuit.

The signal Vpd 12 may be applied through a resistor R1 of for example 1 kΩ to the base of a transistor Tr3, to set up a reference collector current Ic3 of around 2 mA in Tr3, which in turn sets up a 'reference' voltage Vr3 at its collector node. This may be achieved by passing the reference current Ic3 through a resistor R3, of for example 200 Ω, interposed between the supply voltage Vcc and transistor Tr3. A resistor R2 of for example 700 Ω may be connected between the base of transistor Tr3 and ground, to regulate the required bias current of Tr3.

Transistor Tr1 has a collector connected to the supply voltage Vcc through a collector circuit and base feedback circuit 44. Transistors Tr1 10 and Tr2 26 have their base and emitter nodes respectively connected to each other to form a current multiplying mirror circuit. For a common base-emitter voltage Vbe, and in the absence of an RF signal the currents Ib$_1$, Ib$_2$ in the bases and currents Ic, Ic2 in the collectors will be scaled by the ratio of the device emitter areas, in this case 15 since the respective emitter areas are Tr1=15 and Tr2=1. The emitters are connected to each other and then to ground, preferably through an emitter degeneration circuit 20, which may comprise a resistor R12 of for example 5 Ω. The emitter degeneration may alternatively comprise an inductance, a combination of resistance and inductance or may be omitted. The ground may be a ground slug 42 of a package containing the circuit, itself further connected to an external electrical ground.

The input RF signal RFin, 14, is connected to the bases of transistors Tr1 and Tr2, preferably by way of a capacitance C1 of for example 10 pF.

In this example, bias class profiling circuit and base drive circuit 28 comprises a transistor Tr4 having a collector connected to the supply voltage Vcc through a resistance R11 of for example 1 kΩ, an emitter connected to the bases of transistors Tr1 and Tr2, and a base receiving signal Vpd 12 through an impedance. In the example shown in FIG. 2, this impedance comprises a series connection of resistors R8 and R9, for example each 2 kΩ, together with an interposed capacitance to ground C3 of for example 1 pF. A capacitance C2 of for example 10 to 100 pF may be connected between the base and emitter of transistor Tr4.

Transistor Tr4 is an emitter follower, which feeds base current to the current mirror comprising transistors Tr1 and Tr2. The collector current Ic2 in Tr2, hereafter referred to as the 'sense' current, sets up a 'sensed' voltage Vr2 at its collector node. This voltage is preferably at least partly smoothed from RF variation by a series connection of a resistor R13 and capacitor C4 to ground. Example values of these elements are 10 Ω and 4 pF respectively. This arrangement also helps to stabilise the control loop and maintain the third order intercept point ("IP3") and the adjacent channel power ratio ("ACPR"), in some modulation schemes.

According to an aspect of the present invention, the reference Vr3 and sense Vr2 voltages at the collectors of Tr3 and Tr2 respectively are converted to secondary reference and sense currents by resistors R5 and R6, each for example 10 kΩ. A current comparator formed by unity current mirror transistors Tr5 and Tr6 generates a primary error signal current $Ie_1$ 30. The primary error current $Ie_1$,30 is then applied to the base of transistor Tr7, having an emitter connected to the switching transistor Tr8, and a collector connected to receive a current setting signal Vpd12, through circuit 28 and a further series connection of a resistor R10 of for example 2.5 kΩ and a diode D1. Transistors Tr5 and Tr6 with resistors R5 and 6, together with Tr7 and D1 from the error amplifier 16. Resistor R10 may actually, or notionally, be divided into series resistors 10a within circuit 28, and 10b within circuit 32. A capacitance C5 of for example 100 pF is connected between the common node of resistor R10 and diode D1, and ground. The loop stabilisation and bandwidth enhancement circuit is formed by R10 and C5. The primary error current signal $Ie_1$ is DC amplified by transistor Tr7 to become secondary error current signal $Ie_2$ 18, which is used to pull the base voltage of the emitter follower transistor Tr4 of the bias class profiling and base drive circuit 28 down, providing negative feedback until the circuit is in equilibrium and the difference between the sense and reference currents is minimised.

A difference will always exist between the sensed Ic2 and reference Ic3 currents since a secondary error current $Ie_2$ of some small magnitude is required to pull the base of Tr4 down. In the worst case, the sense current Ic2 in Tr2 will typically be a maximum of 5% higher than the reference current Ic3 in Tr3.

It is to be noted that, according to an aspect of the present invention, the circuit provides good immunity to supply rail noise due to the difference mode operation of the current comparator, error amplifier 16. Any noise on the supply voltage Vcc will affect the reference Vr3 and sense Vr2 voltages equally, and will barely appear in the error signal currents $Ie_1$, $Ie_2$.

The current Ic flowing in Transistor Tr1 under stable state conditions is largely determined by the voltage applied by signal Vpd 12 to the transistor Tr3, and the ratio of areas of transistors Tr1, Tr2 and Tr3. For simplicity, the area of transistors Tr2 and Tr3 may be made equal, as may be the associated resistors R3 and R4, in which case the currents Ic2 and Ic3 will be near equal in steady state conditions. Similarly, circuit operation may be simplified if R5 and R6 have identical values and if the current mirror of transistors Tr5 and Tr6 are set to provide a current ratio of 1:1. However, none of these conditions are necessary for the operation of the present invention, and many variations are possible. In the example shown, a voltage of 2.8V applied to the base of transistor Tr3 causes a reference current Ic3 of 2 mA. This operates with error amplifier 16 and circuits 32 and 28 to cause a near-identical 2 mA sense current Ic2 to flow in transistor Tr2. As the current mirror of Tr1 and Tr2 has a 1:15 ratio, this causes a current Ic of 30 mA to flow in Transistor Tr1. The current Ic may be varied by varying the value of the base voltage applied to transistor Tr3.

According to an important aspect of the present invention, there is provided a method and circuit for setting the reference and sense currents, and for performing a comparison which generates the error signal, up to and including the current $Ie_2$ passing through diode D1.

The RF input signal RFin needs to drive a device of effective emitter area sixteen times the emitter area of Tr2. The combination of C2, R11, R9, R10, C3 and C5 mean that Tr4 appears as a near open circuit. This is vital for good Class A operation, since it forces all of the RF signal currents to flow in the base-emitter (BE) junctions of Tr1 & Tr2, leading to a very linear RF voltage-to-current transfer function in the Tr1 input stage, which maintains IP3. This arrangement of transistor Tr4 as an RF open circuit DC feed is considered to be novel, and to form an aspect of the present invention.

Linearity of the RF circuit is also maintained by the active nature of the bias control loop. In a bipolar amplifier, it is generally helpful to provide a low impedance at low frequencies to the base of the active device to short the f2-f1 low frequency product (in a standard IP3 two-tone test), which would otherwise mix up to the 2f1-f2 etc in-band tones. This is typically done with a large value capacitor and inductor to ground. In this circuit, the low impedance at low frequencies is provided by the bias circuit control loop, and no undesirable large-value inductors or capacitors are required. Similarly, other low frequency components such as noise, are also suppressed and do not mix up to cause problems in-band.

Thus, according to an aspect of the present invention, the use of active cancellation of low frequency signals is provided, to avoid degradation of linearity and noise performance, which would otherwise occur. The combination of making Tr4 appear open circuit at RF frequencies, ensuring that all RF current flows into Tr1 and Tr2, and providing active cancellation of low frequency tones, has the effect of boosting the third level intercept point IP3 by around 10 dB, over the performance of a simple design.

In simple terms, low frequency voltage perturbations at the base of Tr1, are cancelled by the action of the bias circuit control loop. The present invention can provide a DC-20 MHz control loop bandwidth, which means even for wide tone spacing, good IP3 is maintained.

Forming a closed loop system, the bias circuit could potentially oscillate at some frequency. To ensure this does not occur, a shunt capacitor C5, connected between the common node of resistor R10 and diode D1 and ground is included. This capacitor reduces the loop gain at increasing frequencies, and is chosen such that the loop gain is well below unity at the point which the loop phase approaches 360°.

An excessively large C5 will still ensure stable operation, but will adversely affect the turn on and turn off times of the circuit, as well as the bandwidth of the loop.

Maintaining a high loop bandwidth has advantages of providing an effective low impedance to the base of the active device (Tr1) for higher frequencies. A low impedance here reduces power levels of any noise or intermodulation products that could mix up close to carrier.

To maintain stable operation, but increase control loop bandwidth a phase lead network can be inserted in the loop, probably most practically at the position of C5. This network will have the same effect of reducing loop gain at increasing frequencies but will have the advantage of delaying the loop phase from reaching 360° until a higher frequency.

An additional benefit of the use of C5 in the position shown is to reduce bias circuit noise levels that would otherwise degrade the noise performance of the RF circuit.

Diode D1 prevents the base-collector junction of Tr7 from conducting, which could waste about 100 μA of current in the power-down state. D1 may be realised as a true diode, or as a transistor configured as a diode, with base & collector nodes shorted.

Resistor R12, connected between the emitter of Tr1 and ground, is a degeneration resistor for RF gain setting. An inductor can be used here instead. Such inductor could be realised as a simple bondwire.

Transistor Tr9 is provided to prevent the circuit burning out in the event that the Tr8 emitter ground connection was not made due to an assembly problem. The Tr8 ground connection would typically be to a separate bondwire on the leadframe, and would not use the package groundslug 42. If the Tr8 ground connection is not made, the emitter of Tr8 will drift toward a high voltage. This brings Tr9 into conduction, clamping the base of Tr4 to a low, voltage. This prevents base current being supplied to transistors Tr1 and Tr2 and so prevents burn-out.

Certain particular benefits of the present invention, and of the embodiment of FIG. 2 in particular will now be summarised.

The circuit of the invention only requires a relatively small supply current from the regulated supply lines. The current control signal line Vpd need only supply about 300 µA. Simple prior art circuits may require an equivalent current of 7 mA or so.

The circuit may be fabricated on a relatively small area of an integrated circuit, even though the circuit may appear to be relatively complicated. Very few off-chip support components are required, making assembly easier, reducing circuit board size and so saving costs.

Apart from R2, the circuit relies only on accurate transistor and resistor ratios and not absolute values. This is very helpful for IC design, where process variations typically lead to variation in absolute values of resistors, while the ratio of values of resistors remains relatively unchanged. Resistor R2 could be embodied as an off-chip resistor of suitable value and temperature coefficient.

The temperature coefficient of Vbe is such that the variation in Vbe of Tr3 nearly compensates for the temperature coefficient of R2. The current through R2 is accordingly largely independent of temperature.

Enhanced IP3 performance, even for tones with large separations. Therefore very applicable to CDMA/WCDMA schemes common in mobile telephony. Control loop bandwidth enhancement may be provided, and the bandwidth of control is preferably at least as wide as the channel width/spacing.

The circuit operates largely as a 'difference mode' circuit, and any noise or modulation on the Vcc line will affect both the 'wanted' Ic3 and 'sense' Ic2 currents equally, and not appear in the error signals $Ie_1$, $Ie_2$. The circuit thus provides excellent noise rejection. Similarly, changes in Vcc have little effect on the circuit.

The circuit provides excellent RF power level immunity when configured for Class A operation. Even 10 dB into compression, the collector current remains stable, showing negligible self biasing.

The basic circuit topology of this invention, discussed above, is suitable for providing stiff bias for Class A type circuits, in which the bias level is unaffected by the applied RF level. However, it may be required to provide a bias level that can be influenced by the RF level. This can be achieved by certain modifications to the circuit of the present invention, for example by the removal of capacitor C2, and the addition of a resistor network between Tr1, 2 and 4.

The circuits of the invention are highly configurable and non-interactive, therefore it is believed that a power amplifier biased with this circuit would be easier to set up, be more manufacturable, and potentially perform better than known alternatives. Additionally, the bias circuit of the invention is suitable for controlling much higher current ratios than that shown in the example Class A circuit of FIG. 2. This further confirms the suitability of a configuration of this invention as suitable for use in HBT power amplifiers.

While the present invention has been discussed with particular reference to HBT MMICs, the bias circuit of the present invention may be applied to any npn bipolar process. Furthermore, the circuit of the present invention could be inverted for implementation in pnp devices, or a combination of npn and pnp devices. The bias circuit of the present invention may also be applied to SiGe devices, with suitable adaptation to cater for the lower base-emitter voltage Vbe of such devices.

The following, and further, modifications may be made to the circuit of FIG. 2, while still achieving at least some of the advantages of the present invention.

The transistors Tr1, Tr2 and Tr3 have been discussed as having certain example emitter area ratios. These ratios are given for examples only, and are in no way limiting. Many suitable ratios may be used, with other parts of the control and/or circuitry amended as appropriate to take into account the scaling factors inherent in the selection of ratios other than 1:1:1.

The 'Current Setting Signal' Vpd 12 to resistor R1 and transistor Tr3 may be split out to its own further control line. The further control line may then readily be used to change the bias level and hence gain of the amplifier in the circuit of the present invention without affecting the rest of the circuit operation, which is difficult with other known circuits. Being able to have some defined control of the amplifier gain is especially attractive for CDMA/WCDMA amplifiers, and would reduce the requirement on dynamic range of known variable gain amplifiers (VGAs). If the current setting signal Vpd 12 to resistor R7 and transistor Tr8 was also split out onto its own yet further control line, then the signal applied to the base of Tr8 may be provided from an unregulated source.

Figure 3:
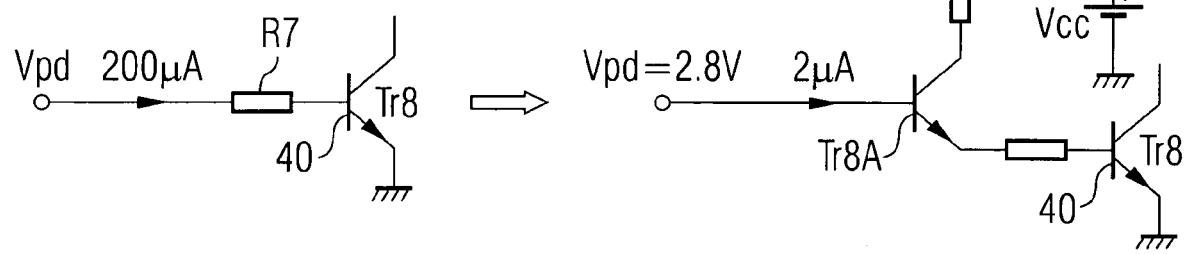
FIG. 3 illustrates the option of providing an additional transistor, to buffer a switching transistor, and reduce the switch control current.

FIG. 3 illustrates the option of providing an additional transistor Tr8A, to buffer transistor Tr8, and reduce the switch control current drawn from Vpd to this switch by a factor of the current gain (beta) of transistor Tr8A.

Figure 4:
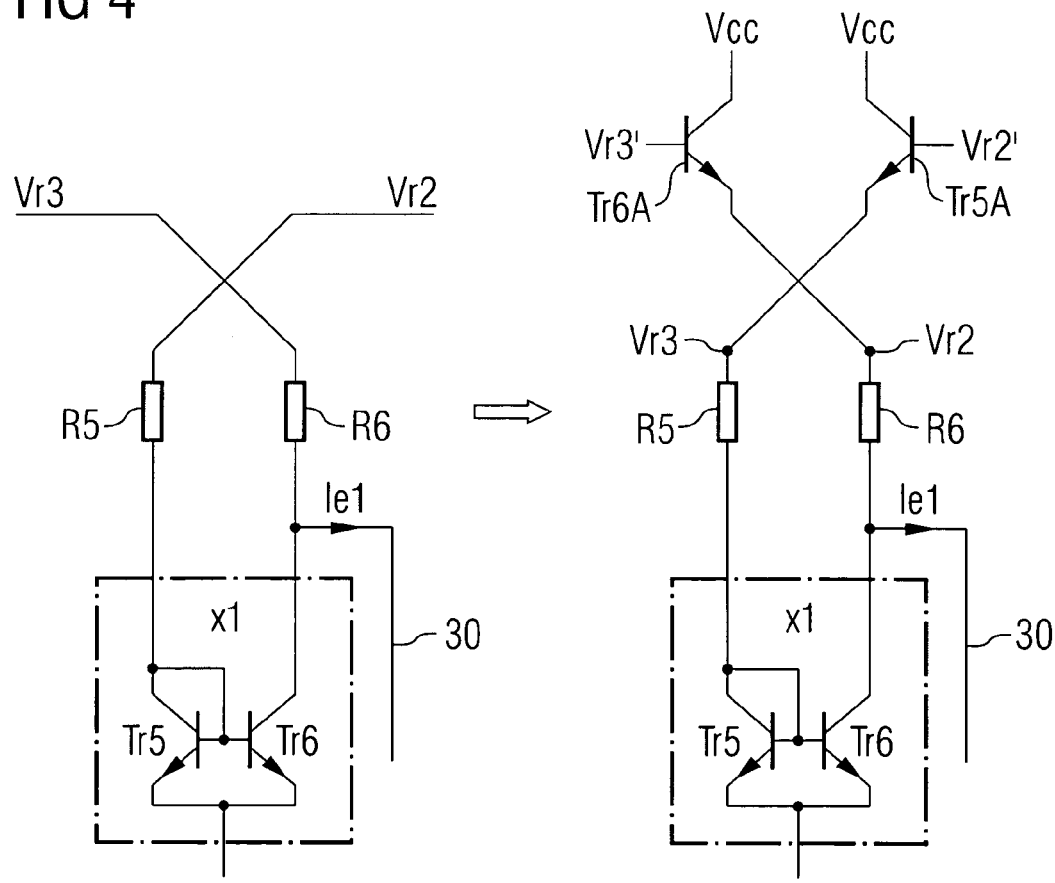
FIG. 4 illustrates the option of buffering the reference and sense current inputs.

FIG. 4 illustrates the option of buffering the reference Vr3 and sense Vr2 voltage inputs to the comparator formed by transistors Tr5 and Tr6 by additional transistors Tr5A, Tr6A, supplied with base voltage Vr2' and Vr3' respectively, to reduce the voltage pulling on those lines. This arrangement is only possible for higher Vcc circuits, due to the cascading of devices.

Figure 5:
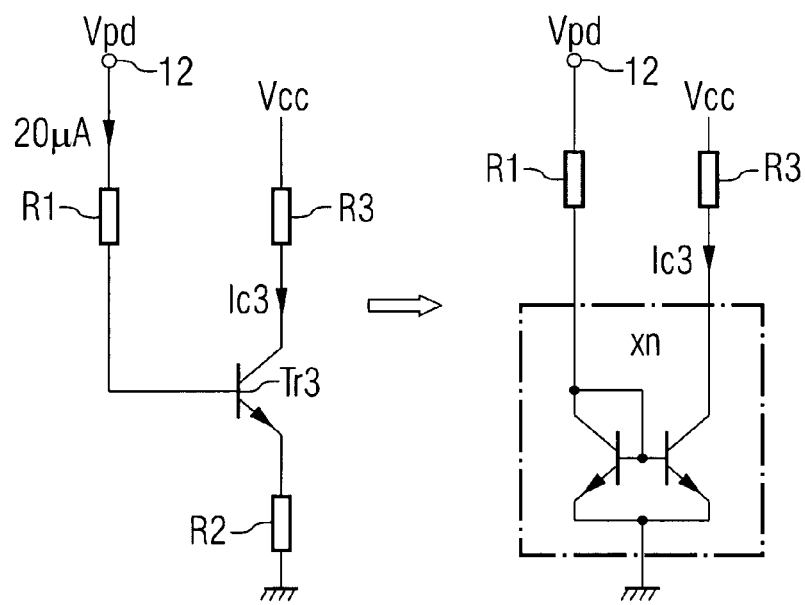
FIG. 5 illustrates an alternative input reference current generator.

FIG. 5 illustrates an alternative input reference current generator, in which the circuitry on the left of the drawing is replaced by the circuitry shown on the right hand side of that drawing.

The circuit on the left is most suited to a regulated reference voltage as so far described. The current on the right is most suited for regulated reference currents, as is preferred by some phone manufacturers.

Figure 6:
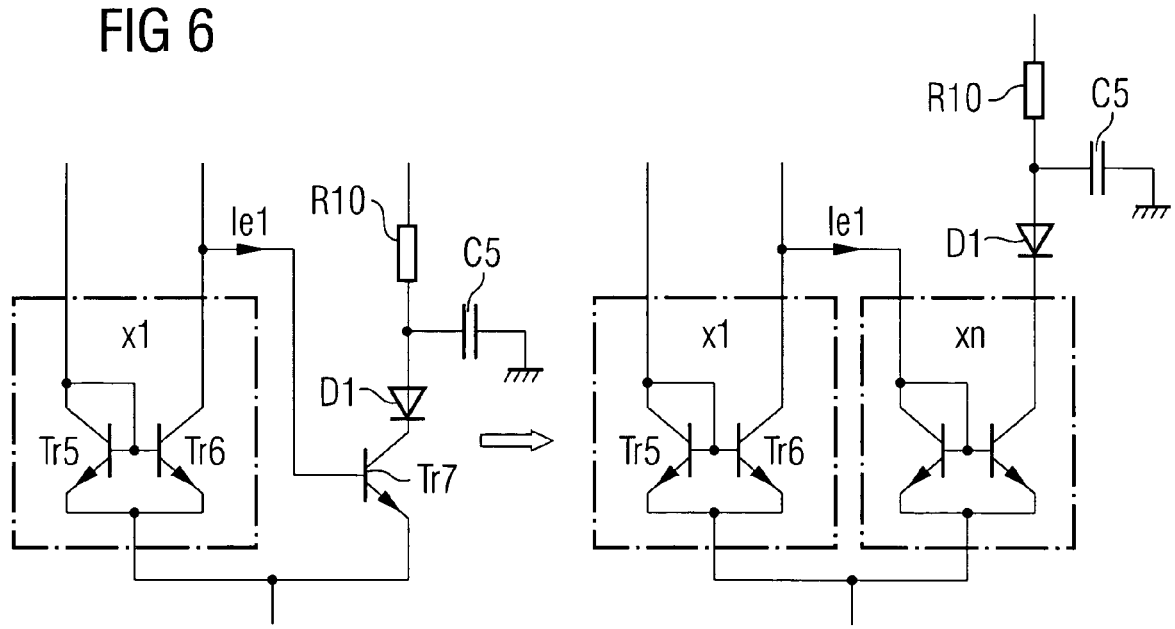
FIG. 6 illustrates an alternative error amplifier.

FIG. 6 illustrates, on the right hand side, an alternative error amplifier, which may be used in substitution for the circuitry shown on the left hand side of the drawing. The second mirror has a large amplification factor, n, which may be non-linear.

Figure 7:
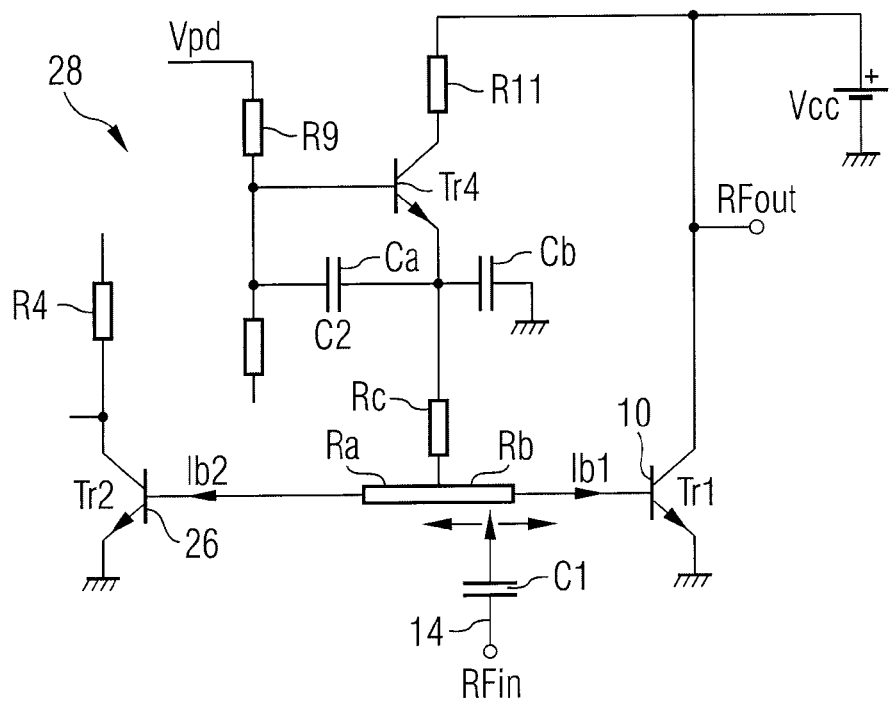
FIG. 7 shows a general 'bias class profiling circuit and base drive circuit'

FIG. 7 shows a general 'bias class profiling circuit and base drive circuit' 28, of which the corresponding circuitry 28 in FIG. 2 is a special case. By varying the position of the RF feed RFin with respect to the resistance Ra/Rb, and the values of each of the components Ca, Cb, Ra, Rb and Rc from zero to infinity, different RF self biasing profiles can be realised, from stiff Class A as discussed above through to Deep Class AB. The resistors Ra, Rb, Rc may also have series inductors respectively associated with them, while the capacitors Ca, Cb may have respective associated series resistors.

Figure 8:
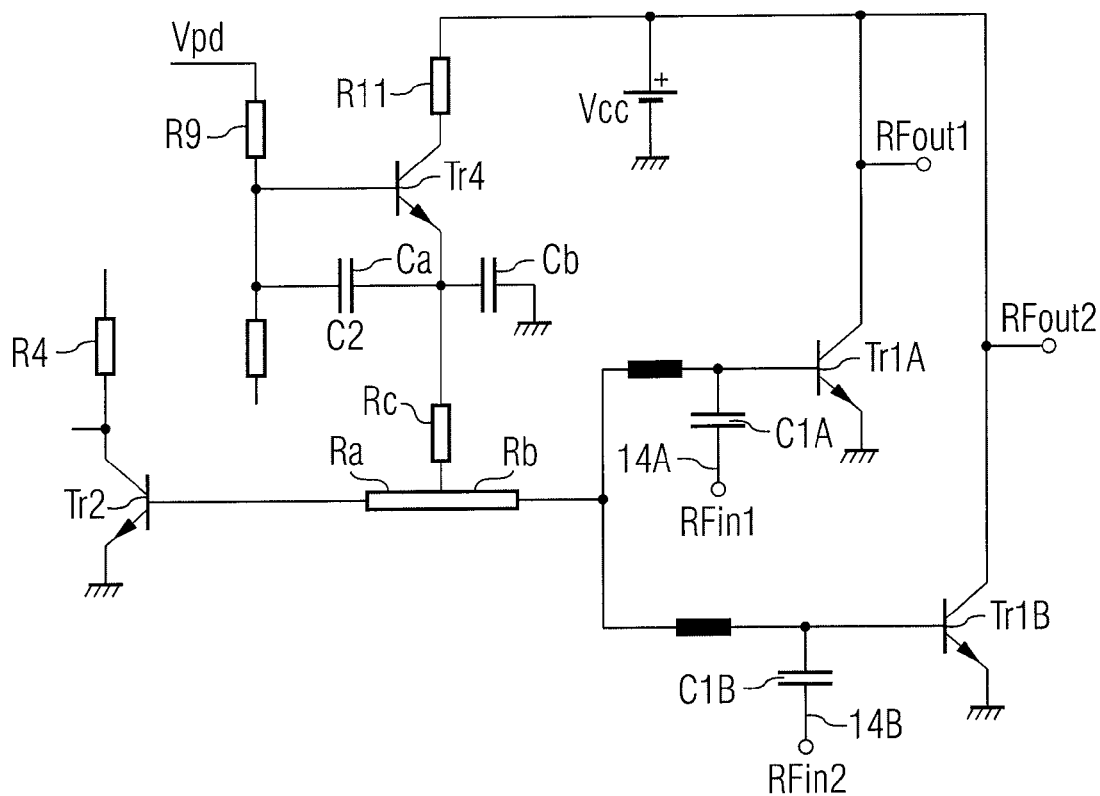
FIG. 8 shows a possible modification which would allow multiple active devices to be driven from a single control loop.

FIG. 8 shows a possible modification to the circuit, which would allow multiple active devices to be driven from a single control loop. The active device Tr1 is replaced by a parallel arrangement of active devices Tr1A, Tr1B. The devices Tr1A, Tr1B each have an emitter connection to ground, possibly through an emitter degeneration circuit 20 as described above. Each has its base connected through a respective inductor of relatively large value to the base signal described for transistor Tr1. Each device Tr1A, Tr1B is connected to receive a respective RF signal RFin1, 14A, RFin2 14B, through a respective capacitance C1A, C1B. This arrangement allows multiple independent RF input signals RFin1, RFin2 to be applied to the bases of respective devices Tr1A, Tr1B and to produce respective amplified RF output signals RFout1, RFout2.

Figure 9:
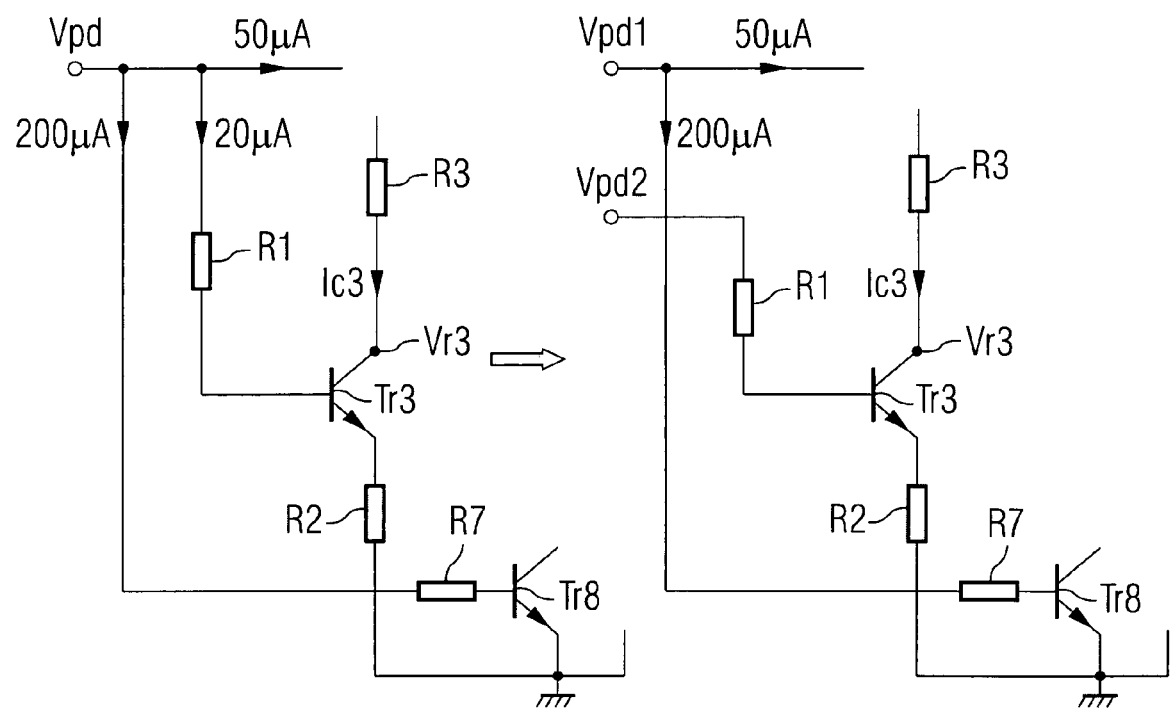
FIG. 9 shows the option of providing direct control to a switching transistor.

FIG. 9 shows the option, discussed earlier, of splitting out the control function of transistor Tr3 by replacing the circuitry of FIG. 2 shown on the left hand side of FIG. 9 with the circuitry shown on the right hand side. If the current setting signal Vpd to Tr3 is split out to a line Vpd2 that can be independently varied, leaving the other control line functions on a different line Vpd1, then the line Vpd2 can be used to give smooth control of the DC quiescent point of the active device(s) Tr1 etc. With a suitable circuit such as shown in FIG. 7, this could be used to give gain control in a power amplifier for example. This would be very attractive for a CDMA/WCDMA amplifiers where significant gain control is required. If the amplifiers had some gain control possibility, the dynamic range required from preceding VGA and baseband components would be much reduced.

A varying voltage applied to the input Vpd2 allows the circuit to be used as an AM modulator. Indeed, a varying 'disturbing' input can be applied at various parts of the control loop to provide this function. A constant RF envelope may be applied as the input signal RFin 14, while the collector current of transistor Tr3, that is the reference current Ic3, may be varied with the required modulating signal. This variation of Ic3 adjusts DC bias to the active device Tr1 10, in turn altering its gain, which effectively provides an amplitude modulation of the RF signal. Variation of the reference current Ic3 may most easily be achieved by modulating the base voltage of transistor Tr3, i.e. the voltage Vpd2.

Figure 10:
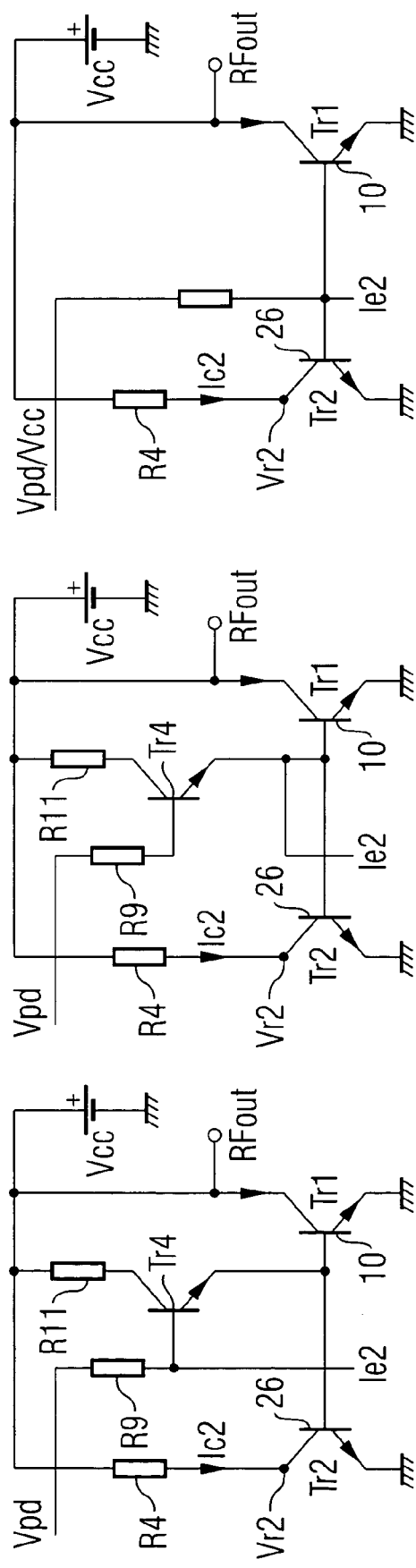
FIG. 10 shows alternative arrangements for the application of the secondary error current signal.

FIG. 10 illustrates alternative arrangements for the application of the secondary error current signal $Ie_2$. The first drawing of FIG. 10 shows the error current application circuitry as shown in FIG. 2, for reference. The second drawing shows the application of the secondary error current signal $Ie_2$ to the emitter of transistor Tr4 instead of to its base. The final drawing shows an option in which the emitter follower transistor Tr4 is not used, but the secondary error signal $Ie_2$ is applied directly to the bases of transistors Tr1, Tr2, and the control signal Vpd is applied through a resistor to the bases of transistors Tr1 and Tr2.

Figure 11:
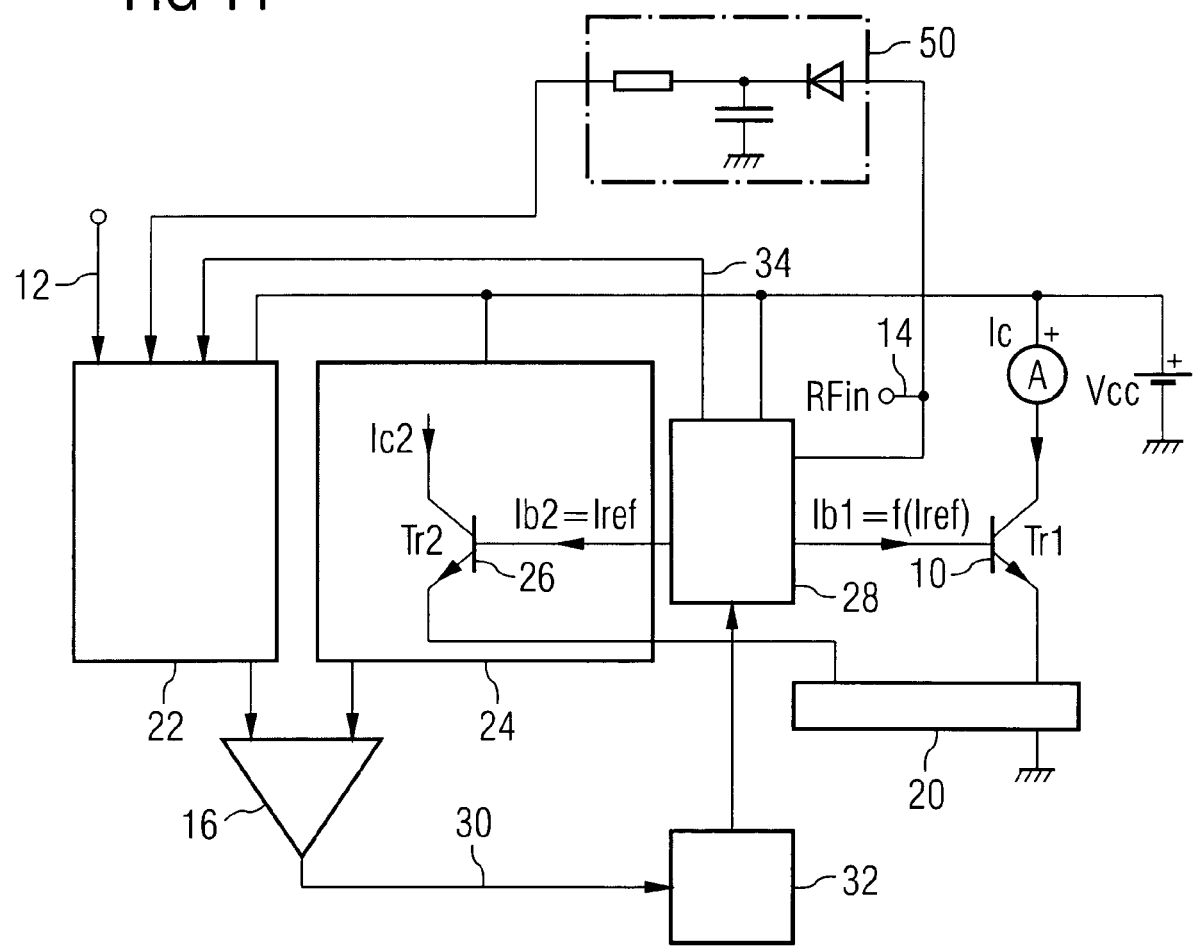
FIG. 11 shows an alternative arrangement for controlling the RF self-biasing profile.

FIG. 11 illustrates an alternative arrangement for controlling the RF self-biasing profile, by allowing the RF input signal RFin to pull the reference current signal, for example through a rectification and conditioning circuit 50.

Figure 12A:
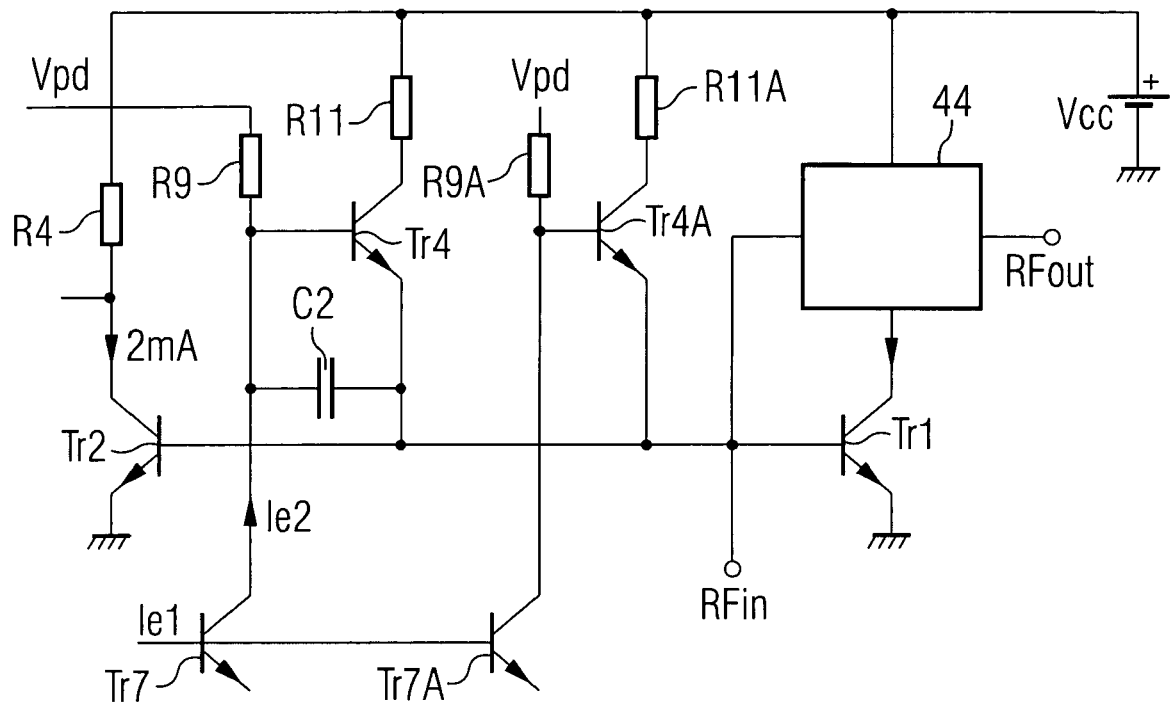
FIGS. 12A-12B show alternative circuits, each providing for the use of an additional emitter follower transistor.
Figure 12B:
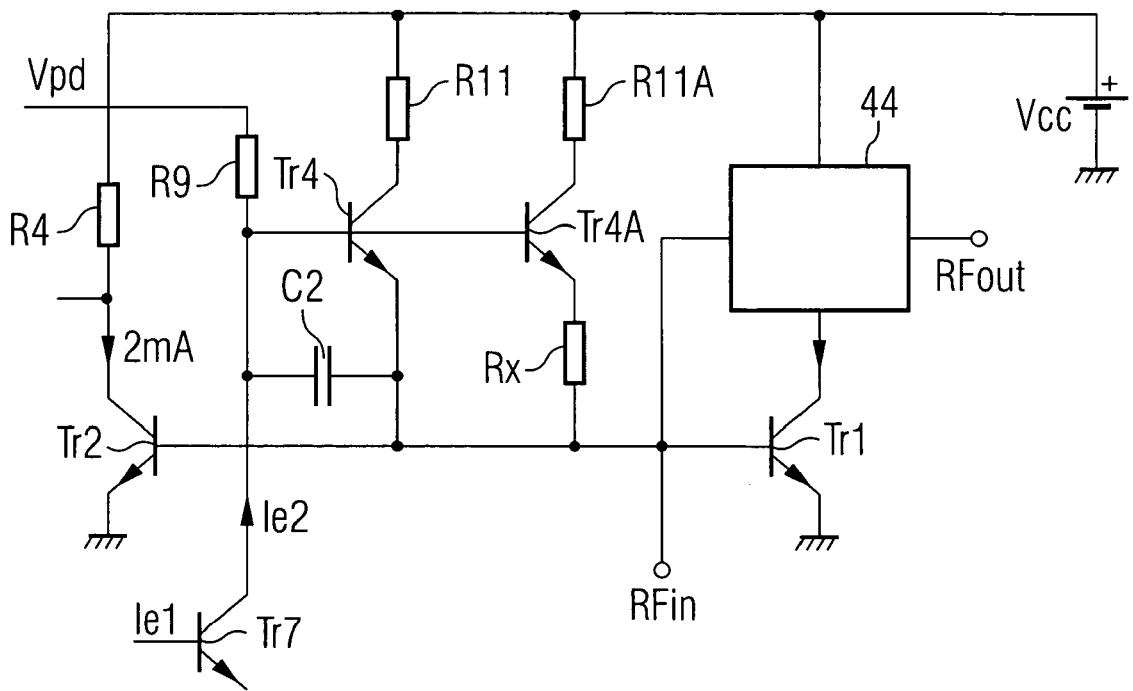

FIGS. 12A-12B illustrate two alternative circuits, each providing for the use of an additional emitter follower transistor Tr4A in combination with one configured for constant current feed. This allows for another mode of operation relevant for power amplifiers. The configuration of the additional transistor Tr4A means that it is 'off' during the forward RF current half cycle, but conducts on the negative half cycle. A combination of component values may be derived in order to provide superior power added efficiency (PAE) at a given linearity, over simpler designs. PAE is defined as: RF power out/(RF power in +DC power consumed).

In FIG. 12A, the additional emitter follower Tr4A receives a base control signal from a duplicate error amplifier transistor Tr7A. Preferably, the additional bias resistor R9A is of higher value than R9, therefore transistor Tr4A is off in the absence of an RF signal.

In FIG. 12B, transistors Tr4 and Tr4A share a common base input signal from the collector of transistor Tr7. Tr4A, however, has an additional emitter resistor RX. Transistor Tr4A is accordingly almost off in the absence of an applied RF signal.

Figure 13:
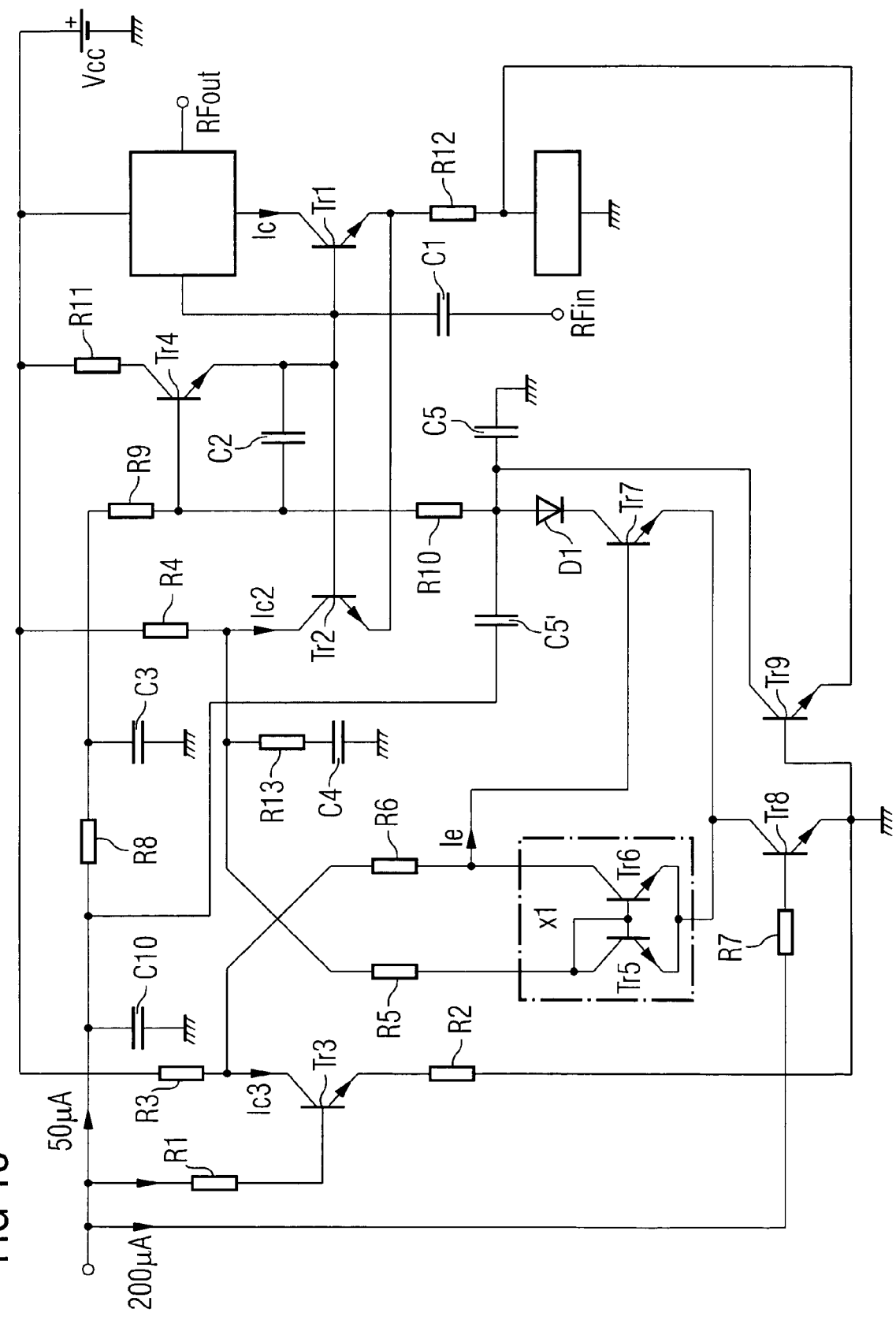
FIG. 13 illustrates a possible modification of the present invention.

FIG. 13 illustrates a possible modification in which capacitor C5 is moved from its original position labelled C5 to an alternative position marked C5'. In the position C5', the capacitor will charge and discharge more quickly as Vpd is applied and removed, but still provides a good RF short to ground. This provides faster turn-on and turn-off of transistor Tr4. An additional off-chip capacitor C10 may be provided, for improved RF noise immunity.

Power Amplifiers

The core concept of the present invention was contrived to address the design of a Driver/VGA, and measurement of manufactured samples has proved the approach, and allows us to provide designs for this application.

The invention may also be applied to the more difficult Power Amplifier application. Simulations of circuit performance predict that the circuit will offer key benefits over existing solutions, as further discussed below.

Future references to these circuits will refer to 'Driver Bias Circuit', being the invention as described above, and 'PA Bias Circuit' being embodiments of the invention as described below, respectively to avoid confusion.

Figure 15:
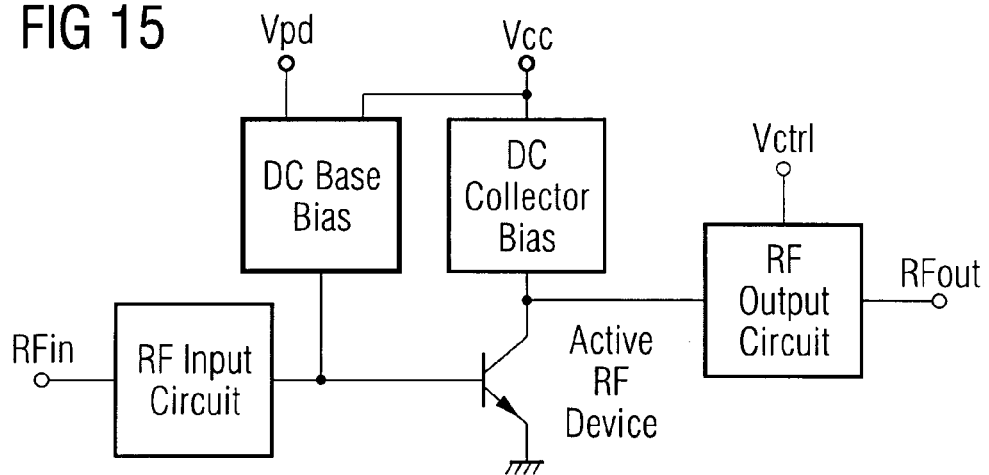
FIG. 15 shows the control signals used to operate a circuit according to an embodiment of the present invention.

The shaded area of FIG. 15 illustrates where the Driver Bias Circuit, for example as illustrated in FIG. 2, has been used. In this case, only a single control line (Vpd) was needed for basic power on/power down function.

Figure 16:
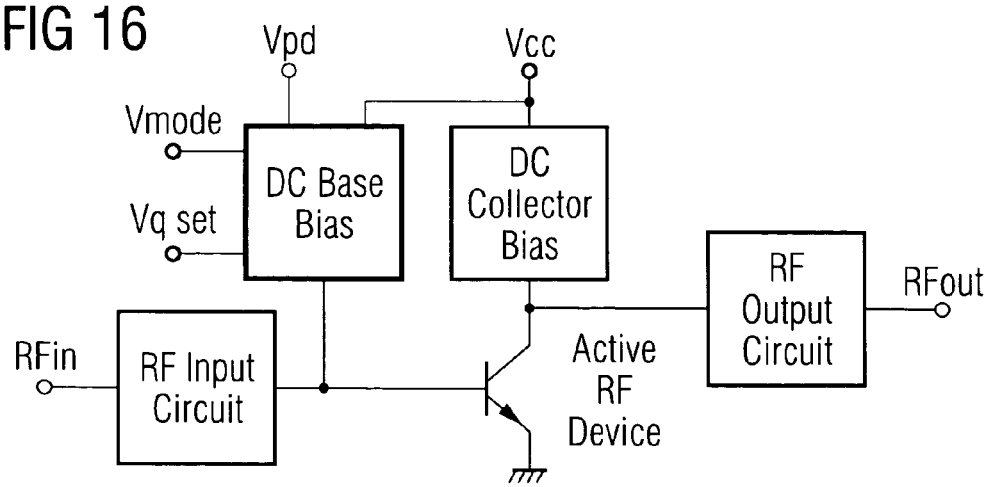
FIG. 16 shows control signals used to operate a circuit according to a further embodiment of the present invention.

The shaded area of FIG. 16 illustrates where a Power Amplifier Bias Circuit according to the resent invention can be used. Such embodiments of the present invention require the power down signal described above (Vpd), but there is also a need for at least one or more control signal.

Control signal Vmode may be provided to change the circuit's operation from a high power mode to a low power mode, enabling improved battery efficiency. These modes may be tailored for best performance for linear modulation (e.g. CDMA) in both modes, and saturated modulation (e.g. AMPS) in one of the modes. The AMPS mode is usually the low power mode, where provision is made for the circuit to self bias to a high power, but with poor linearity. Linearity is not important for AMPS, and this approach maximises efficiency.

Vq-set is an optional additional control line that may be made available in the Power Amplifier Bias Circuit, to control the quiescent current point, which can be used to improve battery efficiency in some implementations. The provision and operation of control signals Vmode and Vq-set may readily be implemented, and are further discussed later.

Simulations of a power amplifier using the bias circuit of the present invention indicate an 80% reduction in control line current draw, as compared to alternative circuits. Other manufacturing benefits exist, which lead to a higher yield and lower cost per chip.

The power amplifier bias circuit according to the present invention provides at least some of the following benefits:

- low control current draw from Vpd, typically 1 mA per stage, compared to 5 mA per stage for comparable known circuits;
- excellent process tolerance, as the circuit function relies largely on component ratios, rather than absolute values;
- excellent temperature tolerance;
- positive impact on RF performance (minimum degradation); and
- very compact on-chip implementation.

The power amplifiers in question are generally those intended to be powered by a battery in a portable equipment, such as a mobile telephone. To maintain operating efficiency, and battery lifetime, these amplifiers are typically biased for deep Class AB operation. In such bias arrangement, the activated amplifier draws minimum current from the power supply when the RF input signal is low. As the RF level increases, the amplifier 'self biases' and the DC supply current rises to a higher level, thus maximising RF to DC efficiency. To further increase efficiency, the bias circuit may be required to provide a number of modes of operation, depending on the output power required, and the type of modulation used. These modes involve switching/varying quiescent bias point and bias impedances, and enable efficiency/linearity to be maximised over a broad power range, and different modulation types.

The following description illustrates the modification of the bias circuit of FIG. 2 to achieve such bias modes.

In summary, certain aspect of the present invention will allow for a single amplifier to operate as a Deep Class AB Power Amplifier for at least some of the following:

a) Linear Modulation (CDMA, W-CDMA, WLAN etc); with fixed quiescent bias, optionally including a switched quiescent bias point (typically a 'high power' and low power' linear mode), or a continuously variable quiescent bias point. One of such modes may include provision for saturated modulation (AMPS, GSM, FM).

b) Saturated Modulation (AMPS, GSM, FM etc); with fixed quiescent bias.

The extra control lines Vmode, Vq-set illustrated in FIG. 16 may be embodied as follows.

Vmode: A two state 'digital' control line. To change the 'mode' of the circuit in a switching action from typically a low quiescent current, to a high quiescent current. Additional Vmode lines (e.g. Vmode1, Vmode2, . . . VmodeN) may be introduced in some of the following embodiments, where more than two states may be required.

Vq-set: Either continuously variable, or digital, control line that can be used to vary the quiescent current in the active RF device.

The description of the present invention, with reference to FIGS. 1 and 2 describes in general terms how the circuit could be modified for a controlled self-biasing action. The following description describes particular embodiments or circuit additions that are possible to realise variable quiescent bias point operation.

The following description references the circuit illustrated in FIG. 2. The controlled changing of the quiescent bias point of Tr1 can be most easily achieved by the addition of circuitry to modify the output Vr3 of the 'reference' generator, or 'sense' Vr2 parts of the existing circuit, prior to their application to the comparator Tr5, Tr6. Modification of the 'reference' generator output Tr3 effectively tells the circuit to settle at an alternative bias level. Modification of the 'sense' output Vr2 adds or subtracts an amount prior to the comparator Tr5, Tr6, such that the quiescent bias level changes appropriately to keep the control loop in equilibrium.

Alternatively, moving the DC injection point for the Tr1-Tr2 mirror will also cause a bias point shift, as described later.

Figure 17:
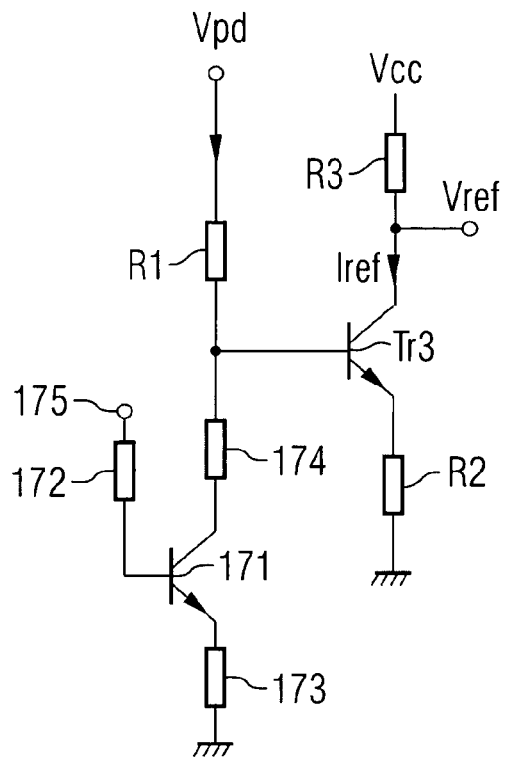
FIGS. 17-19 show possible variants enabling modification of the bias point by adjusting the reference signal.

Firstly, there will be discussed certain embodiments for changing the bias point by, 'pulling' the reference 'wanted' signal Vr3. As illustrated in FIG. 17, One transistor 171 and three extra resistors 172, 173, 174 are added to 'pull' the base voltage of Tr3 down, under the influence of a switched Vmode control line, or a variable Vq-set line 175. Such operation reduces Ic3 and hence changes the output Vr3 to the comparator, and ultimately reduces the collector current Ic in Tr1. This embodiment provides for reduced Control Circuit Ic current. Upper and lower limits may be placed on the value of the reference current Ic3 by use of this circuit. This embodiment also has disadvantages in that the current drained from the control line increases, and dynamic control range is limited.

Figure 18:
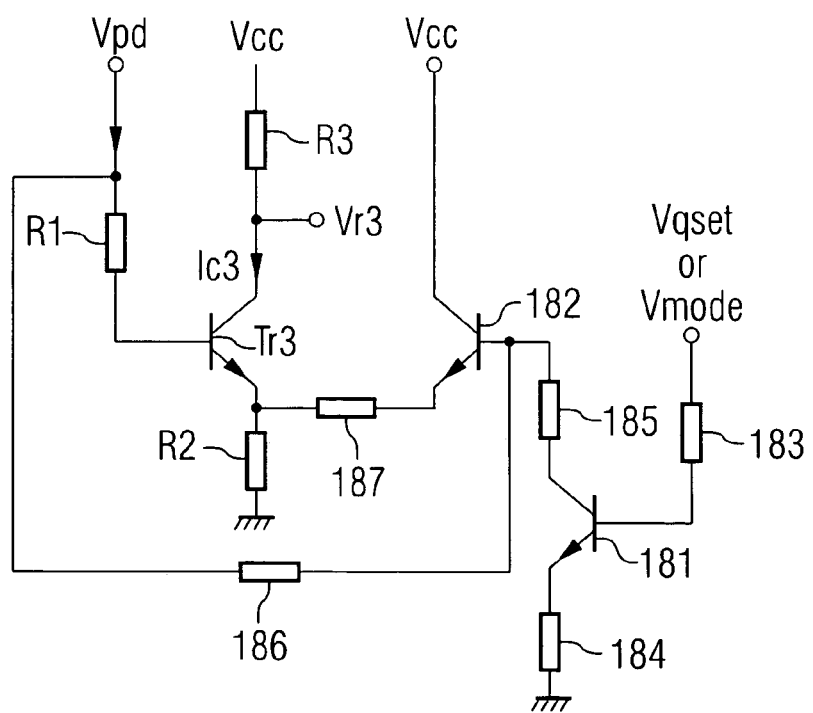

In the embodiment shown in FIG. 18, two transistors 181, 182 and up to five extra resistors 183, 184, 185, 186, 187 are added to inject extra DC current into R2, thus reducing Ic3, and hence changing the Vr3 output to the comparator Tr5, Tr6. Transistor 182 can be made larger than Tr3 to get to a lower minimum Iref Ic3 if required. The connection point of resistor 187 to resistor R2 may be moved to somewhere along R2 to move control range to a lower Vq-set if required.

This embodiment offers fairly simple circuit construction and operation. The current consumption reduces at low quiescent levels. The circuitry has a low impact on the regulated supply line current Ipd and Imode, and allows accurate setting of maximum and minimum current values.

This embodiment may provide only limited dynamic control, and may cause some increase in the regulated supply current due to direct pulling on the regulated supply line. The circuit of this embodiment may also be sensitive to variation in high values of Vq-set.

Figure 19:
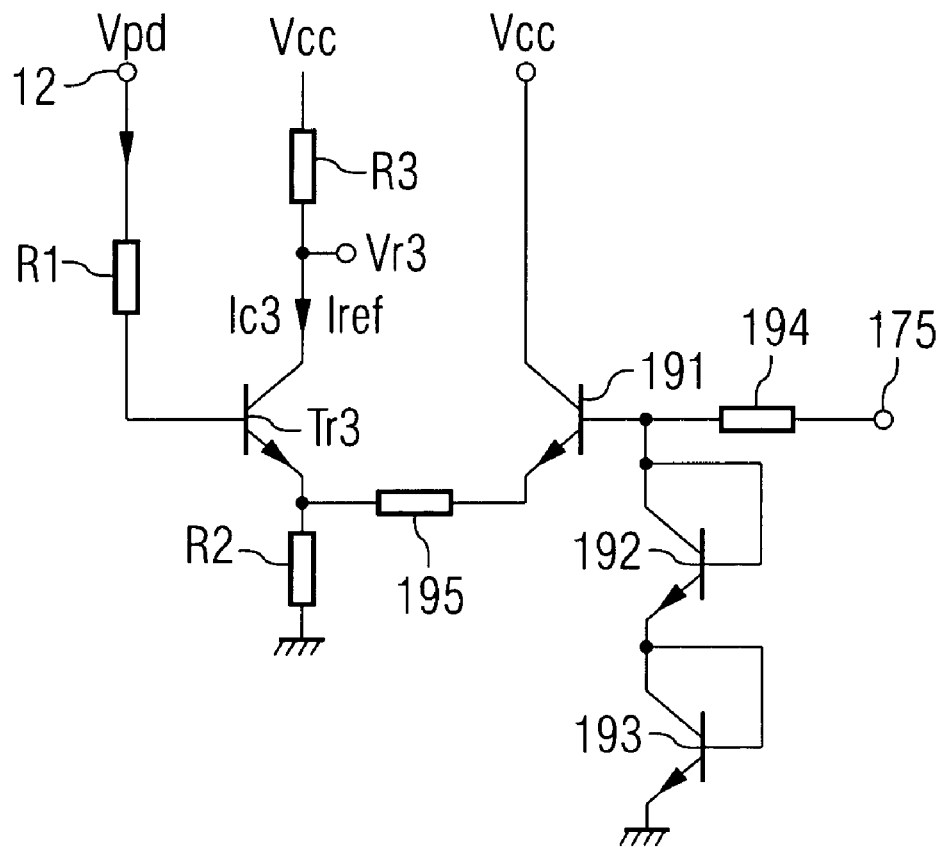

Alternatively, as illustrated in FIG. 19, three transistors 191, 192 and 193, two resistors 194, 195 are added to inject extra DC current into resistor R2, thus reducing Iref, Ic3, and hence raising the reference voltage output to Vr3 to the comparator. The node between R2 and 195 may be moved effectively to somewhere along R2 to move control range to a lower Vq-set.

This particular variation provides a simple control circuit. The current consumption from supply voltage Vcc reduces at low quiescent levels while the current drained from the regulated supply, Ipd, does not increase. However, such variation alone may not provide sufficient dynamic control range. The 'low' current minimum extreme may be difficult to set accurately enough over the necessary range of temperature or other variables.

In addition to the variations and embodiments described above, certain variations and modifications may be made to the sense circuit, as will now be described.

Figure 20:
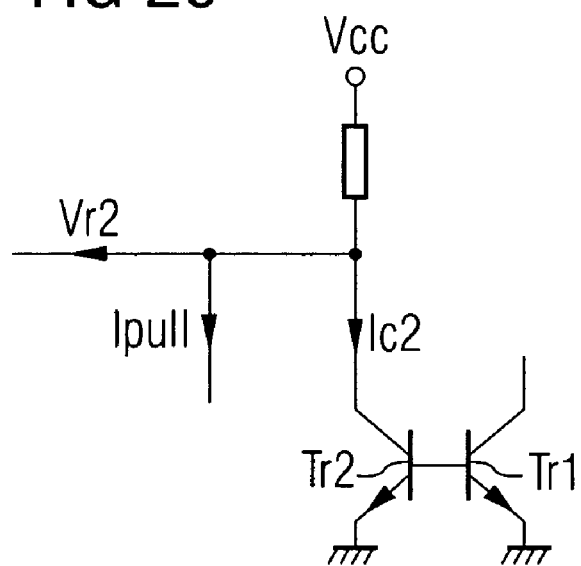

FIGS. 20-27 each illustrate a variation which may be applied to the circuit of the invention to vary the 'sense' signal Vr2. A first variant is illustrated in FIG. 20. A current sink may be provided as shown to pull a current Ipull from the sense voltage output Vr2. By drawing current Ipull, the sense voltage Vr2 will decrease, and the loop will compensate as if the main device Tr1 were running at a higher quiescent level than required, such that Ic(Tr1) reduces as required.

This is a very simple modification to allow control of the quiescent current range. Controllable quiescent current range may be increased by this modification. However, the corresponding control circuit supply current from Vcc does not reduce despite lower bias levels.

FIG. 21 shows a possible implementation of the modification of the circuit of FIG. 20. Two additional transistors 211, 212, and one resistor 213 form a current mirror. As Vq-set or Vmode, 175, rises, current is pulled out from the sense node, changing the sense voltage level Vr2, and the loop will compensate as if the main device Tr1 were running at a higher quiescent level, and will apply a corrective error signal to reduce it.

This is a relatively simple implementation, providing low current drain from the regulated supply, Ipd, without affecting the control sense operation. The supply current from Vcc does not reduce at lower bias levels. The currents drained by signals Vmode and Vq-set may be a little high for a 1:1 current mirror, so other current mirror ratios may be chosen. Unless Vmode/Vq-set is adequately regulated, it may not be possible to set the 'low' levels accurately enough, leading to the possibility of turning the whole circuit off.

FIG. 22 shows another possible variation, provided to pull the sense node, and draw minimum current from Vmode or Vq-set 175. This variation requires the addition of transistor 221 and resistors 222, 223. This circuit however, is still susceptible to Vmode/Vq-set rail regulation variation.

While this simple modification reduces the current drain of signals Vmode or Vq-set, 175, the whole control loop supply current from Vcc does not reduce at lower bias levels. Unless Vmode/Vq-set is adequately regulated, it may not be possible to set the 'low' levels accurately enough, leading to a danger of turning the whole circuit off.

FIG. 23 illustrates a further optional modification which aims to desensitise the circuit to Vmode or Vq-set rail regulation variation. This may be achieved by utilising the accurate existing Vpd line to limit both the maximum and minimum 'Ipull' currents, hence accurately setting the overall maximum and minimum limits of the quisecent current Ic in Tr1.

Two additional transistors 231, 232, and up to four additional resistors 233, 234, 235, 236 can be added as shown to pull the sense node, and draw minimum current from Vpd 12 or Vmode/Vq-set 175, while providing improved current setting accuracy. This junction between resistors 235 and 234 may be effectively moved along resistor 234 to move control range to a lower Vq-set value. Transistor 232 can be bigger than transistor 231 if necessary, to achieve a required value of Ipull.

This variation is simple, and allows maximum and minimum values of quiescent points to be accurately set using Vpd 12 only. The values of each of the currents drained from Vpd, Vmode and Vq-set may be set quite low. The voltage Vq-set is continuously and smoothly variable between defined minimum and maximum current setting points. Accurate digital control of the voltage Vmode may be provided between defined minimum and maximum control points, with no need for regulated Vmode/Vq-set.

However, this variation does not allow the supply current from Vcc to reduce at lower bias levels, and the required value of supply current required to drive the new circuit is slightly higher. Care needs to be taken in operating the circuit of this variation, as the control sense is opposite to usual. If Vmode or Vq-set are not greater than Vpd, then the maximum current value will not be well controlled.

Figure 24:
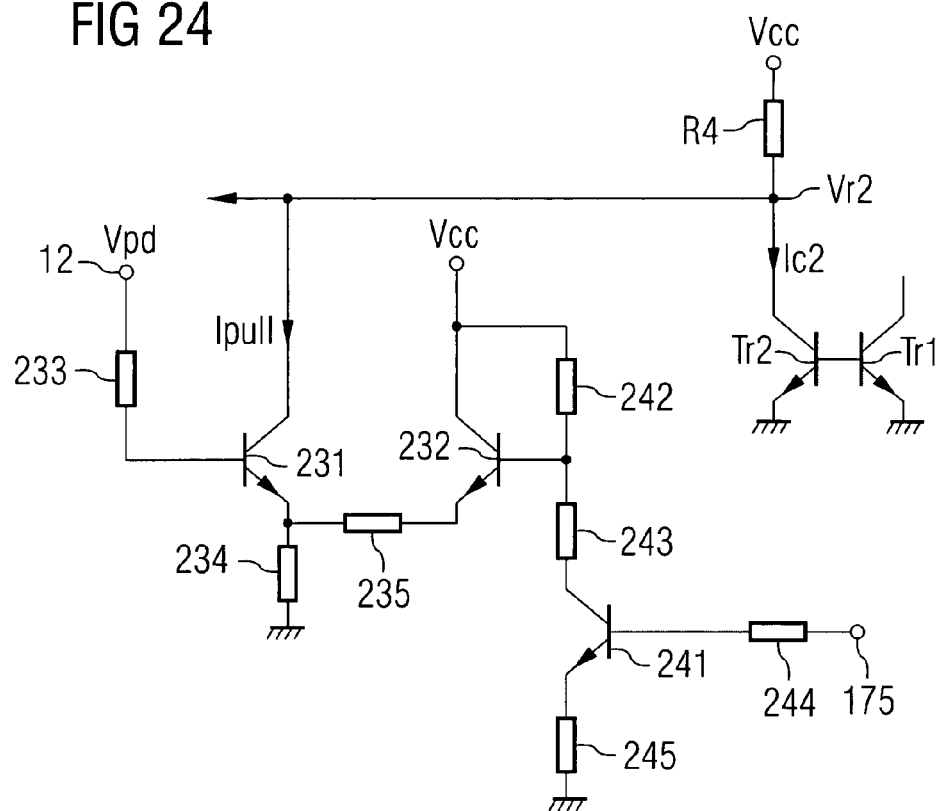

Another possible modification is shown in FIG. 24. It resembles the modification of FIG. 23, but avoids the need for Vmode or Vq-set to be any greater than Vpd for accurately setting the maximum current limit. Three additional transistors 231, 232, 241, and up to seven resistors 233, 234, 242, 243, 244, 245 and 235 can be added as shown to pull the sense node Vr2. The 233, 234, 231 circuit sets the minimum current value accurately. The remaining circuit is provided to shut transistor 231 off for high current operation. The maximum current value is set by Tr3 as usual.

The maximum and minimum quiescent points can be accurately set using Vpd only, with this modification. The values of current may be held low. The control sense is unaffected. A smooth Vq-set adjustment is provided, which is continuously variable between defined minimum and maximum current points. Accurate Vmode digital control may be provided between defined minimum and maximum control points. Maximum voltage of Vmode or Vq-set need not be regulated accurately.

While this amendment adds rather a lot of components, each is physically small and the overall circuit is not significantly increased in size by this modification. While the supply current from Vcc does not reduce at lower bias levels, it is slightly higher to drive the new circuit. The current setting will be most sensitive to Vq-set at the point where transistor 241 becomes active.

Figure 25:
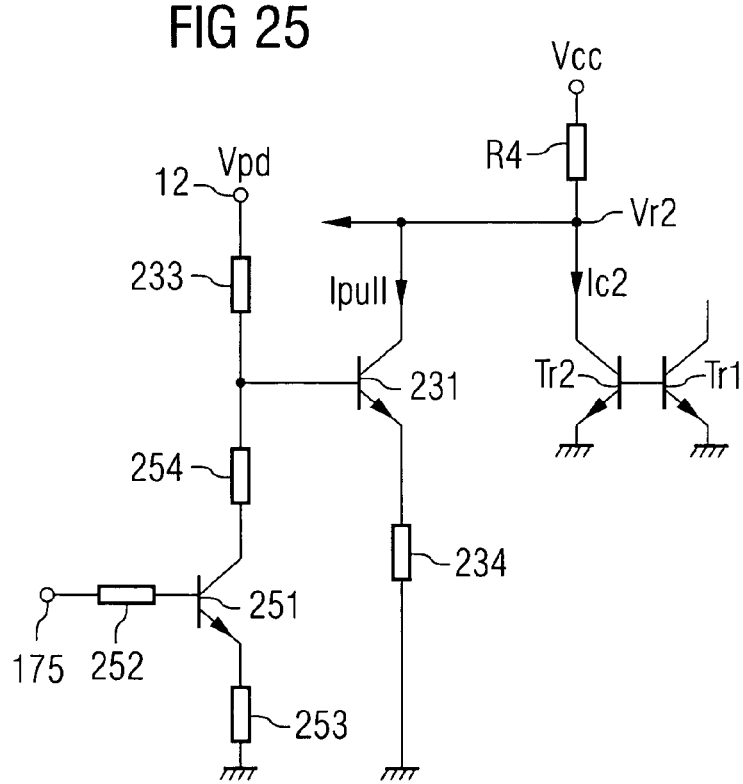

FIG. 25 illustrates a further modification, having the same functionality as that of FIG. 24, but also addresses the potential steep Vq-set slope issue. This is achieved at the expense of an increased current drain from the regulated supply, Vpd. The Vmode/Vq-set input is used to control a transistor 251, through a base resistor, 252. Appropriate bias is provided by emitter resistor 253 and collector resistor 254. This modification is again relatively simple, and allows maximum and minimum quiescent points to be accurately set using Vpd only. The current drained by signals Vmode, Vq-set may be kept relatively low. The value of Vq-set may be continuously and smoothly variable between defined minimum and maximum current limits. Accurate digital control of the voltage Vmode may be provided between defined minimum and maximum control points. There is no need for regulated Vmode or Vq-set. However a relatively high current may be required from signal Vpd. The supply current from Vcc does not reduce at lower bias levels, but does not increase either. The control sense direction is reversed.

Figure 26:
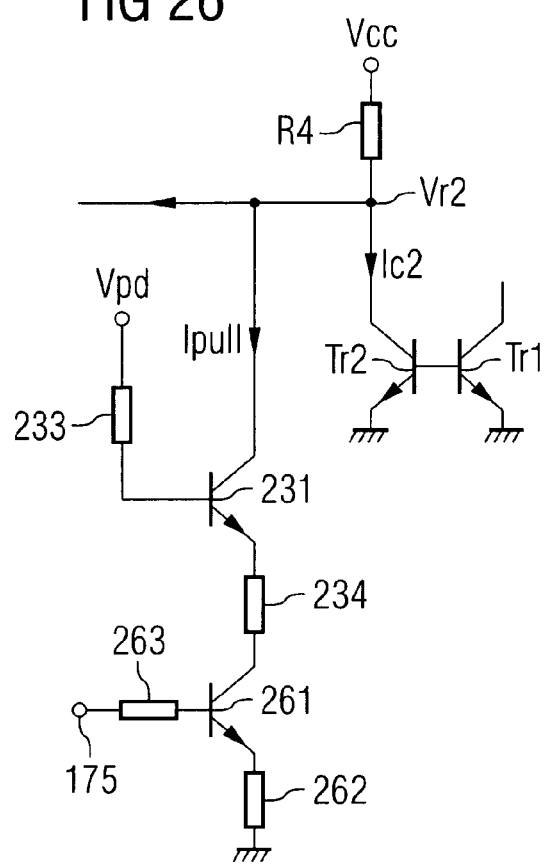

FIG. 26 illustrates another modification, an alternative to the modifications illustrated in FIGS. 24-25. This modification provides a reduced current drain from Vpd, 12, at the expense of the accuracy of the minimum current setting.

A transistor 261 is added to pull the emitter of transistor 231 down, under control of the Vmode/Vq-set signal 175. Pull-down transistor 261 is provided with a base resistor 263 and an emitter resistor 262.

When the control voltage Vmode/Vq-set 175 is low, the pull-down current Ipull reduces to zero. Transistor Tr1 thus passes the full current determined by the setting of Tr3 and the resulting reference voltage Vr3 (see FIG. 2).

When the control voltage Vmode/Vq-set 175 is high, the pull-down current Ipull takes the value (Vpd−Vbe(231)−Vcesat(261))/R(234)+R(262), where the FIGS. 231, 261, 234, 262 refer to the circuit elements of FIG. 26 carrying corresponding reference labels.

When the control voltage Vmode/Vq-set is set at an intermediate value, the current Ipull takes a corresponding intermediate value.

This modification is relatively simple and allows the maximum quiescent point to be accurately set using Vpd only. All of the current values drawn by Vpd, Vmode and Vq-set may be held relatively low. The voltage Vq-set is a smoothly and continuously variable control between defined minimum and maximum current setting points. Accurate Vmode digital control may be provided between defined minimum and maximum control points. There is no need for regulated Vmode or Vq-set. While the supply current from Vcc does not reduce at lower bias levels, it is not increased either. A disadvantage of this circuit is that as Vmode/Vq-set runs, the value of Ipull reaches a maximum, and then has a tendency to reduce again. The value of resistors should be chosen carefully. Alternatively, the lower network formed by 261, 262 and 263 could be replaced by the network formed by 211, 213 and 212 of FIG. 21.

Figure 27:
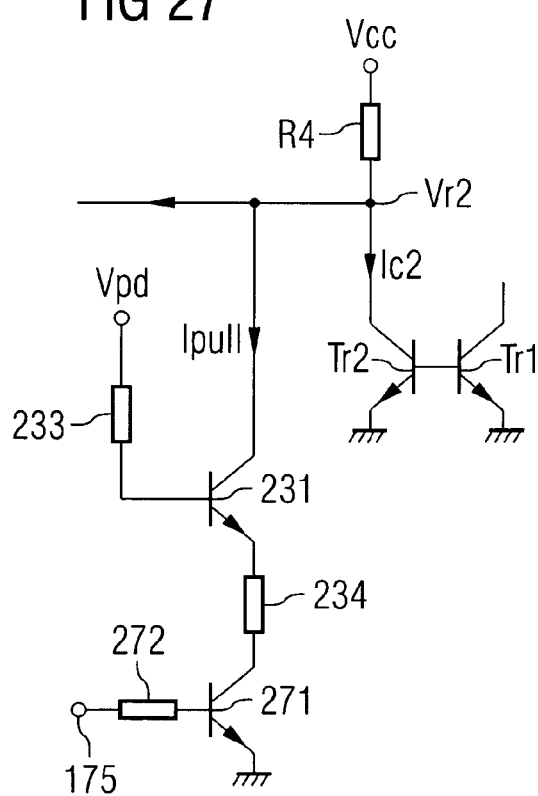

FIG. 27 illustrates a switched only version of the modification of FIG. 26. This alternative is simple, and requires no emitter resistor such as shown at 262 in FIG. 26. The minimum and maximum quiescent points are accurately set using Vpd only. The current drawn by voltages Vpd and Vmode are both relatively low. The operation of the Vmode control sense is unaffected. Accurate Vmode digital control is provided between defined minimum and maximum control points. There is no need for regulated voltages Vmode or Vq-set. The supply current from Vcc is unaffected at lower bias levels.

The present invention accordingly provides a bias circuit for a bipolar transistor, which employs a current comparator, such as a current mirror, to generate error current signals $Ie_1$, $Ie_2$ indicating the difference between a required current and an actual current. The required current is set by the value of a resistor, R2. Similar known bias circuits draw significant current from a regulated voltage line. The present invention allows some of this current to be drawn from the unregulated supply instead. As an illustration, a bias circuit according to the present invention may draw no more than 1 mA per stage from the regulated voltage line, whereas typical known circuits drew 5 mA. The differential mode operated by the current comparator offers improved noise immunity and so allows an unregulated supply to be used. The total amount of current drained by the circuit of the invention is similar to that drawn by known circuits, but it is taken from a different—less "expensive"—source.

While the current comparator may comprise a 1:1 current mirror, other ratios may also be used. The bias circuit of the present invention is particularly suitable for use with heterojunction bipolar transistors. Such transistors have high Vbe, such as 1.3V. This is very high compared to the supply voltage and makes circuits using stacked devices difficult, or impossible.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

I claim:

1. A bias circuit for a bipolar transistor (Tr1), comprising a signal input connection arranged to communicate an input signal to a base terminal of the bipolar transistor (Tr1); a bias current supply arranged to supply a current to a collector terminal of the bipolar transistor (Tr1); and a ground connection arranged for coupling to an emitter terminal of the bipolar transistor (Tr1); the bias circuit further comprising:
    a reference current generation circuit for generating a reference current indicative of a required current through the bipolar transistor (Tr1);
    a current sensing circuit for providing a sense output signal indicative of an actual current flowing through the bipolar transistor (Tr1);
    a comparator and an error amplifier arranged to receive the reference current and the sense output signal, and to generate an error signal indicative of a difference between the required current and the actual current, and to apply a corresponding correction to the voltage of the base of the bipolar transistor (Tr1), thereby to cause the actual current to approach the required current,
    wherein the bias circuit is arranged for connection to both a regulated power supply and an unregulated power supply, whereby the reference current is provided by the regulated power supply, and substantially the remainder of current drawn by the bias circuit in operation is provided by the unregulated power supply.

2. A bias circuit according claim 1, wherein the current sensing circuit comprises a further bipolar transistor (Tr2) arranged in a current mirroring configuration with the bipolar transistor (Tr1), to provide a signal indicative of the current to the collector terminal of the bipolar transistor.

3. A bias circuit according to claim 1, further comprising a bias class profiling circuit and base drive circuit for receiving the unregulated power supply and the error signal, and, in response to the unregulated power supply and the error signal, and in accordance with a predetermined required bias class profile, applying a control current to the base of the bipolar transistor (Tr1).

4. A bias circuit according to claim 3, wherein the bias class profiling circuit and base drive circuit comprises a further transistor (Tr4) having a collector arranged to receive a current from the unregulated power supply; an emitter connected to the base terminal of the bipolar transistor (Tr1); and a base terminal connected through a first base resistance to a regulated power supply, and through a second base resistance to receive the error signal.

5. A bias circuit according to claim 1, further comprising a loop stabilization and bandwidth enhancement circuit, including a phase lead network, arranged to receive the error signal from the error amplifier, and to adapt the error signal before application of the correction to the base of the bipolar transistor.

6. A bias circuit-according to claim 1, wherein the comparator comprises a current mirror arranged for use as a comparator.

7. A bias circuit according to claim 1, further comprising power supply connections, and a controlled switching means for selectively connecting the bias circuit to the low voltage power supply connection.

8. A bias circuit according to claim 7, wherein the controlled switching means is controlled by a signal derived from the regulated power supply.

9. A bias circuit according to claim 1, wherein the signal input connection is additionally connected to the reference current generation circuit, thereby allowing an input signal to influence the value of the reference current.

10. A bias circuit according to claim 3, further comprising a connection between the bias class profiling circuit and base drive circuit, and the reference current generation circuit, thereby allowing the input signal to influence the value of the reference current through the bias class profiling circuit and base drive circuit.

11. A bias circuit according to claim 3, wherein the bias class profiling circuit and base drive circuit comprises:
    a first resistance connected between the base terminals of the bipolar transistor (Tr1) and the further bipolar transistor (Tr2);
    a control transistor (Tr4) having a control terminal coupled to a control voltage, a current receiving terminal coupled to a supply voltage and a current providing terminal coupled at a first point along the first resistance; and the signal input connected at a second point along the first resistance.

12. A bias circuit according to claim 11, wherein at least one of the terminals of the control transistor is coupled via a corresponding resistance.

13. A bias circuit according to claim 11, wherein the second point is adjustable along the first resistance.

14. A bias circuit according to claim 11, wherein at least one capacitor is provided, connected between the current-providing providing terminal and at least one of:

the control terminal; and a ground voltage.

15. A bias circuit according to claim 1, further comprising at least one additional control line enabling the supply current to the collector terminal of bipolar transistor (Tr1), to be varied continuously or discretely between desired levels.

16. A bias circuit according to claim 15, wherein a modulating signal is applied to one of the additional control line(s), the modulating signal thereby causing a variation in the current flowing through the bipolar transistor (Tr1), in turn altering its gain to provide amplitude modulation of an input signal.

17. A bias circuit according to claim 8, wherein a rectifier is placed between the signal input connection and the reference current generation circuit.

18. An amplitude modulator comprising a bipolar transistor (Tr1) and an associated bias circuit for the bipolar transistor, according to any preceding claim, wherein a modulating signal is arranged to be applied so as to modulate the value of the reference current, and the signal input connection receives an RF signal to be modulated.

19. A bias circuit according to claim 4, further comprising a connection between the bias class profiling circuit and base drive circuit, and the reference current generation circuit, thereby allowing the input signal to influence the value of the reference current through the bias class profiling circuit and base drive circuit.

* * * * *